(12) United States Patent
Zhang et al.

(10) Patent No.: US 12,354,704 B2
(45) Date of Patent: Jul. 8, 2025

(54) ACTIVE CURRENT CONSUMPTION SAVE MODE FOR NON-VOLATILE MEMORY USING FAST PROGRAMMING

(71) Applicant: Western Digital Technologies, Inc., San Jose, CA (US)

(72) Inventors: Ke Zhang, Shanghai (CN); Linnan Chen, Shanghai (CN); Liang Li, Shanghai (CN); Minna Li, Shanghai (CN); Chin-Yi Chen, San Jose, CA (US); Xiaojia Jia, San Jose, CA (US); Muhammad Masuduzzaman, Chandler, AZ (US); Xiang Yang, Santa Clara, CA (US)

(73) Assignee: SANDISK TECHNOLOGIES, INC., Milpitas, CA (US)

( * ) Notice: Subject to any disclaimer, the term of this patent is extended or adjusted under 35 U.S.C. 154(b) by 176 days.

(21) Appl. No.: 18/225,491

(22) Filed: Jul. 24, 2023

(65) Prior Publication Data
US 2024/0296877 A1    Sep. 5, 2024

Related U.S. Application Data

(60) Provisional application No. 63/449,106, filed on Mar. 1, 2023.

(51) Int. Cl.
*G11C 7/10* (2006.01)
*G11C 7/12* (2006.01)
*G11C 8/08* (2006.01)

(52) U.S. Cl.
CPC ........ *G11C 7/1096* (2013.01); *G11C 7/1039* (2013.01); *G11C 7/12* (2013.01); *G11C 8/08* (2013.01)

(58) Field of Classification Search
CPC .......................................................... G11C 7/10
USPC ................................................... 365/189.11
See application file for complete search history.

(56) References Cited

U.S. PATENT DOCUMENTS

| | | | | |
|---|---|---|---|---|
| 2006/0245233 | A1* | 11/2006 | Mikolajick | H10B 69/00 365/100 |
| 2007/0002645 | A1* | 1/2007 | Roehr | G11C 16/12 365/195 |
| 2016/0372185 | A1* | 12/2016 | Shim | G11C 16/0483 |
| 2020/0388338 | A1* | 12/2020 | Yang | G11C 16/3445 |
| 2023/0197164 | A1* | 6/2023 | Diep | G11C 16/10 365/185.2 |

* cited by examiner

*Primary Examiner* — Muna A Techane
(74) *Attorney, Agent, or Firm* — Dickinson Wright PLLC

(57) ABSTRACT

A memory apparatus and method of operation are provided. The apparatus includes memory cells connected to word lines and disposed in memory holes coupled to bit lines. A control means successively applies each of a series of pulses of a program voltage to selected ones of the word lines while simultaneously applying one of a bit line program voltage and a bit line inhibit voltage to ones of the bit lines coupled to the memory holes containing groups of the memory cells connected to the selected ones of the plurality of word lines to program the groups of the memory cells with data. The control means maintains a voltage applied to ones of the plurality of bit lines as the bit line inhibit voltage in response to the ones of the plurality of bit lines remaining unselected when programming a next one of the groups of the memory cells.

20 Claims, 31 Drawing Sheets

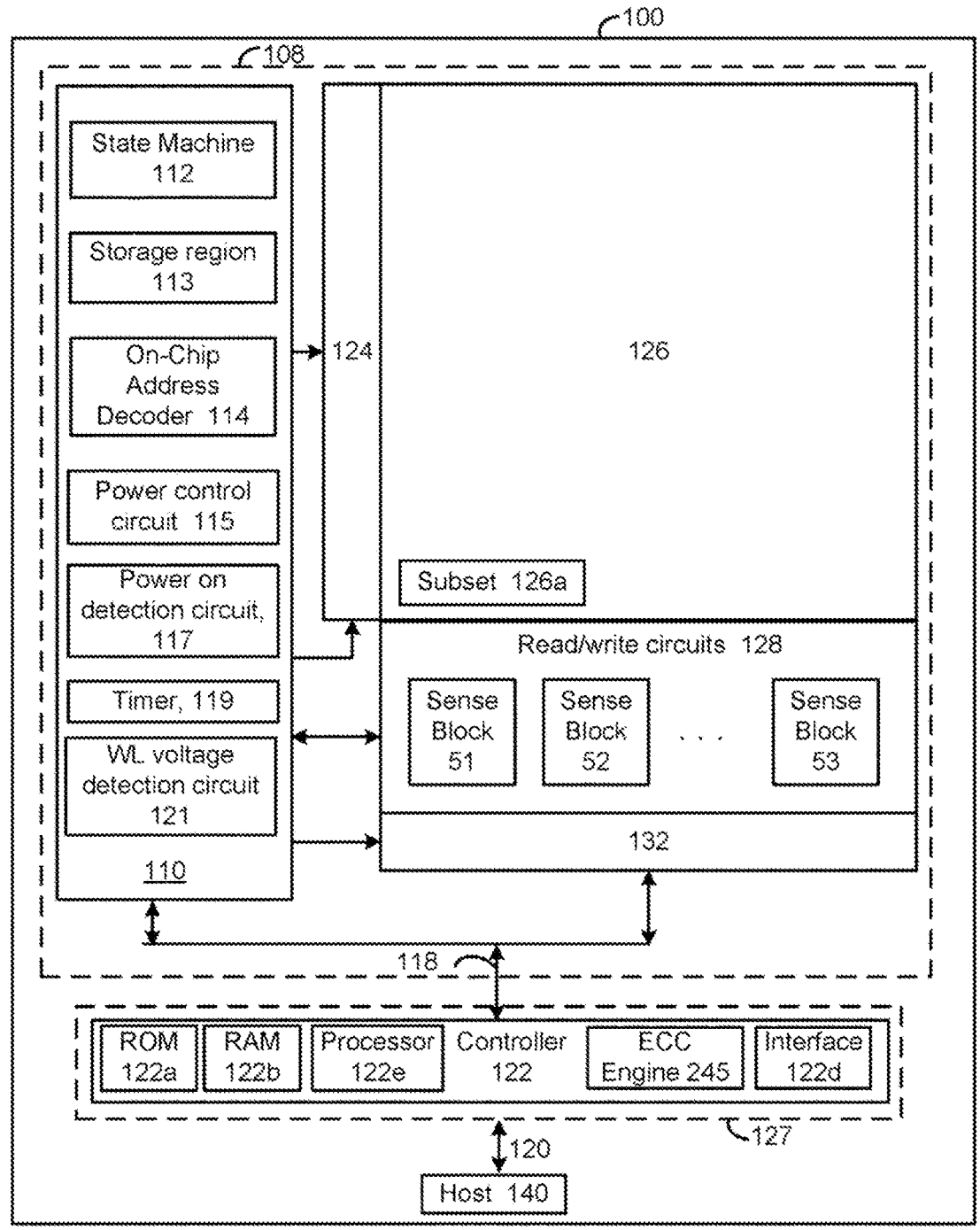
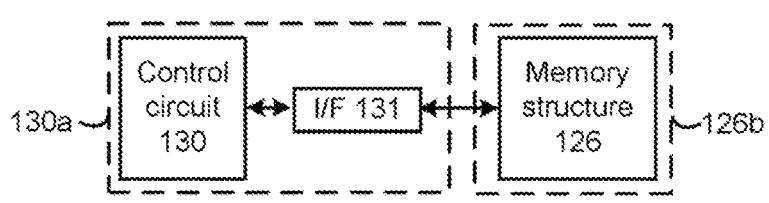
FIG. 1A
FIG. 1B

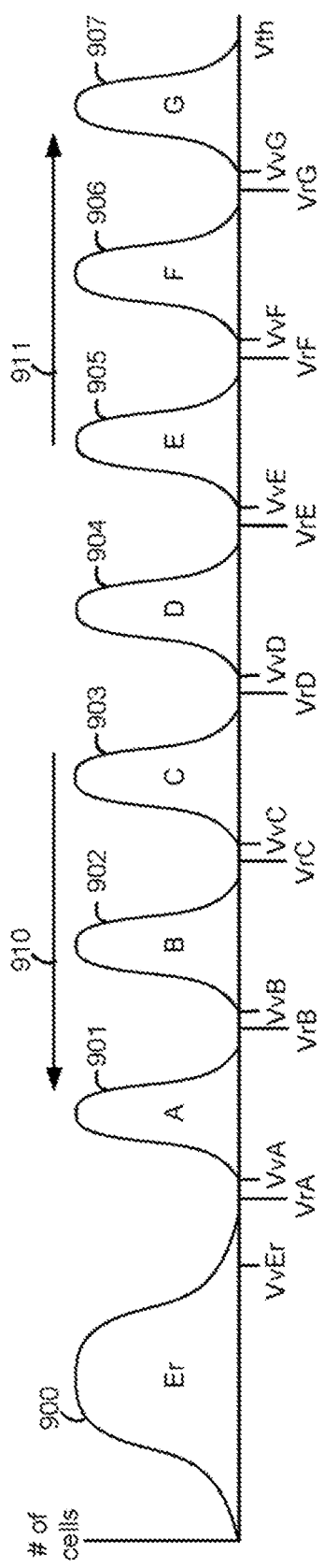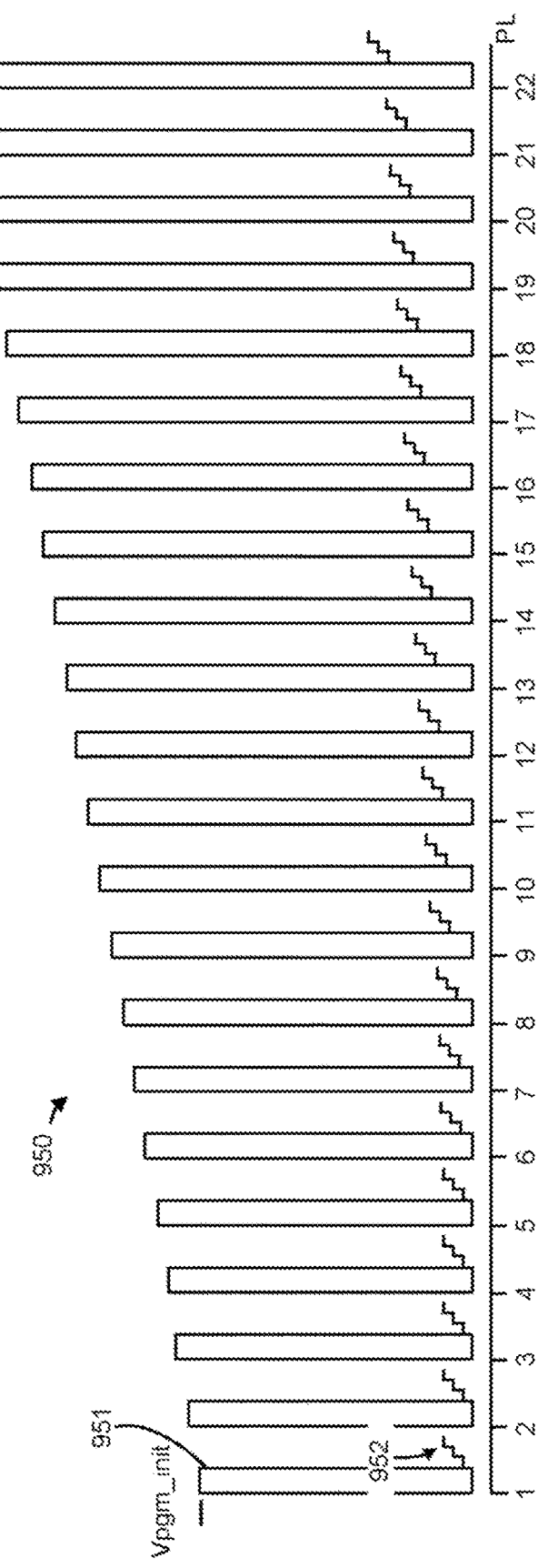
FIG. 9A
FIG. 9B

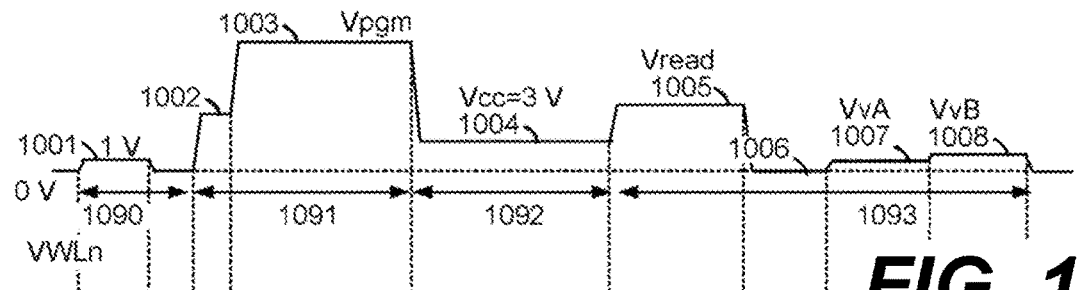
FIG. 10A
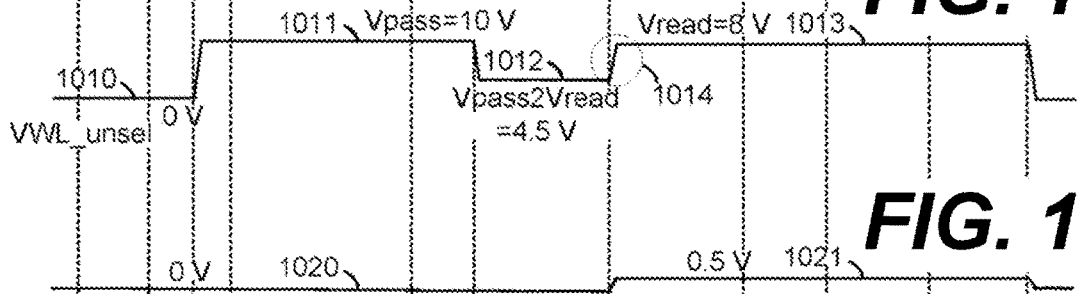
FIG. 10B
FIG. 10C
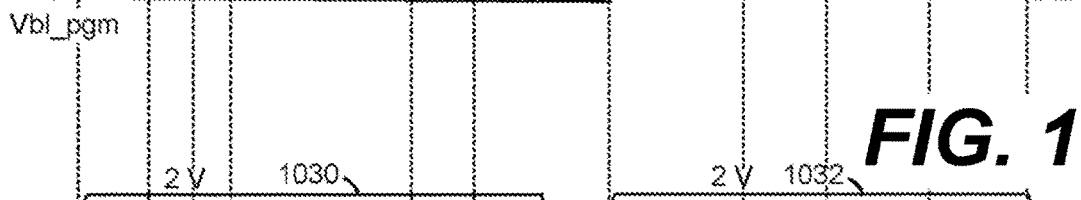
FIG. 10D
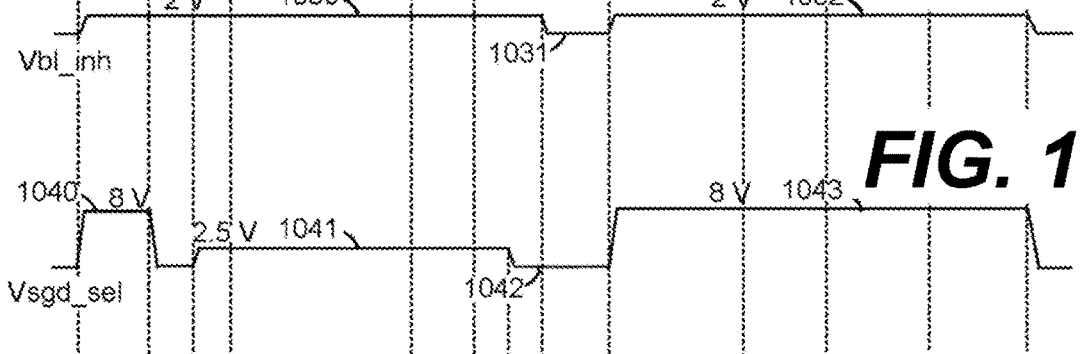
FIG. 10E
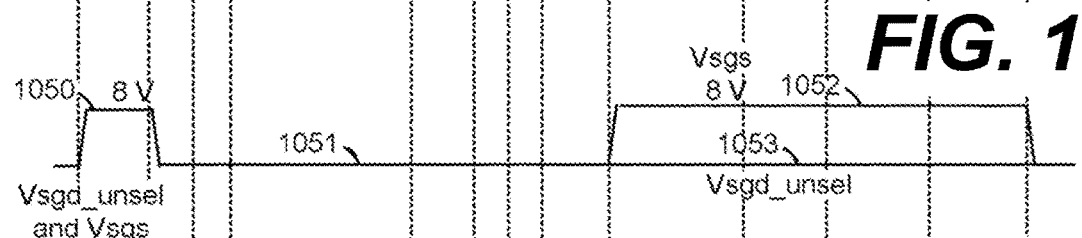
FIG. 10F
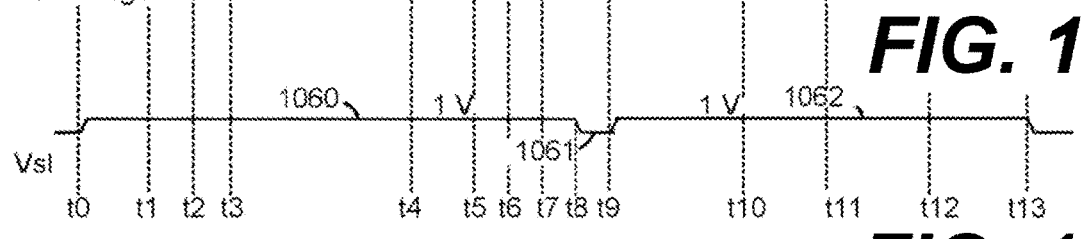
FIG. 10G

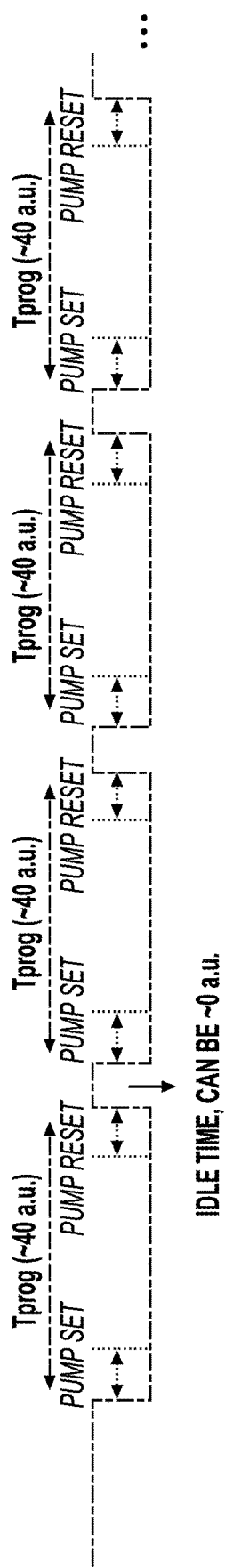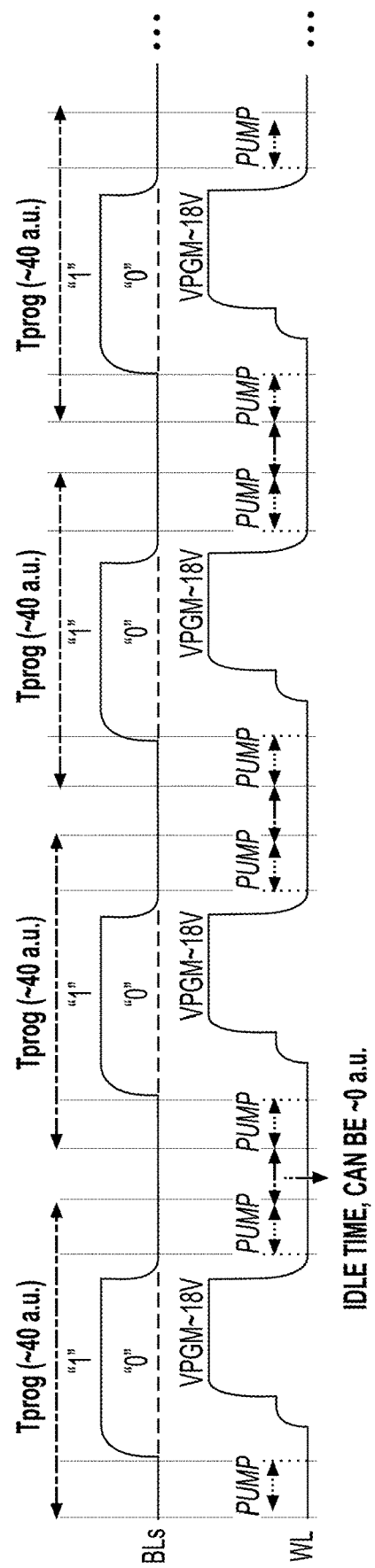

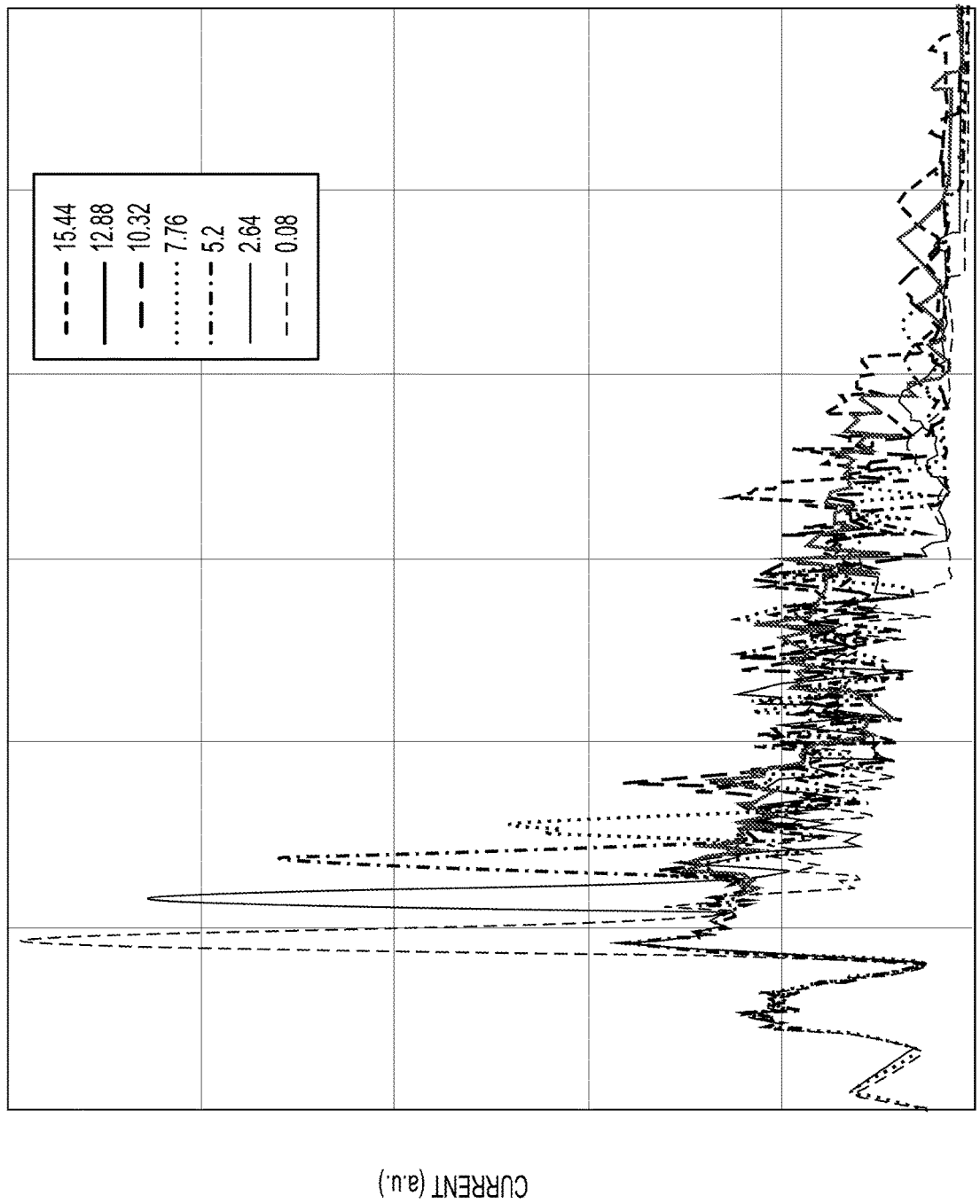

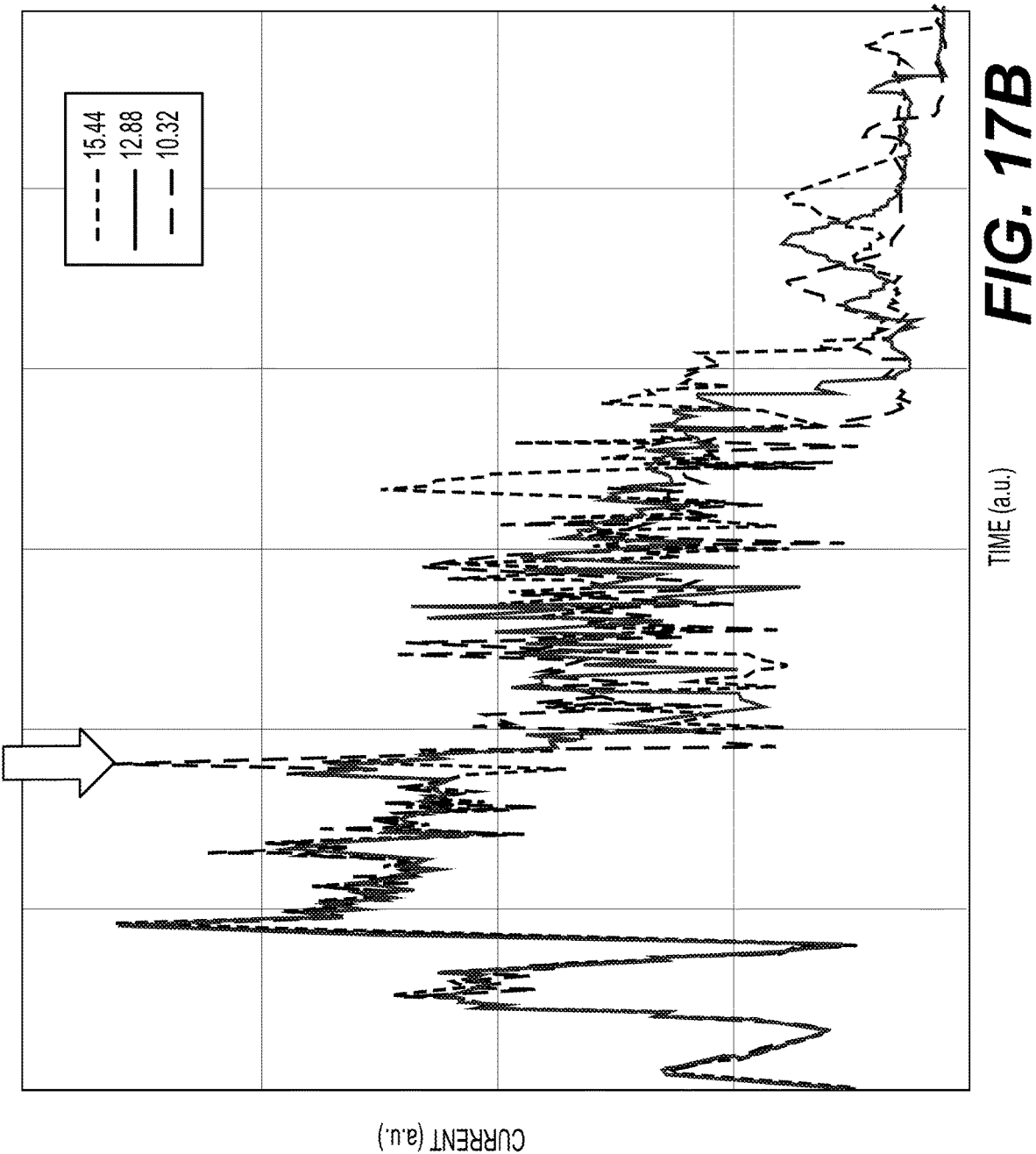

| BL CASE | $WL_n$ | $WL_{n+1}$ | ACTION AT PR_CLK | ACTION AT P5_CLK |
|---|---|---|---|---|
| 1 | 1 | 1 | VBL = VSS | VBL = VSS |
| 2 | 1 | 0 (INHIBIT) | VBL = VSS | VBL RAMP UP TO VHSA |
| 3 | 0 (INHIBIT) | 1 | VBL RAMP DOWN TO VSS | VBL = VSS |
| 4 | 0 (INHIBIT) | 0 (INHIBIT) | VBL = VHSA | VBL = VHSA |

ADD = XXh _ICC_SAVE

| [7] | [6] | [5] | [4] | [3] | [2] | [1] | [0] | HEX | 1T | OPTION |
|---|---|---|---|---|---|---|---|---|---|---|
|  |  |  |  |  |  |  | 0 | 0h |  | DISABLE |
|  |  |  |  |  |  |  | 1 |  |  | ENABLE |

FIG. 23

SUCCESSIVELY APPLYING EACH OF A SERIES OF PULSES OF A PROGRAM VOLTAGE TO SELECTED ONES OF THE PLURALITY OF WORD LINES WHILE SIMULTANEOUSLY APPLYING ONE OF A BIT LINE PROGRAM VOLTAGE AND A BIT LINE INHIBIT VOLTAGE TO ONES OF THE PLURALITY OF BIT LINES COUPLED TO THE MEMORY HOLES CONTAINING GROUPS OF THE MEMORY CELLS CONNECTED TO THE SELECTED ONES OF THE PLURALITY OF WORD LINES TO PROGRAM THE GROUPS OF THE MEMORY CELLS WITH DATA DURING A PROGRAM OPERATION, THE ONES OF THE BIT LINE PROGRAM VOLTAGE AND THE BIT LINE INHIBIT VOLTAGE SELECTED BASED ON THE DATA BEING PROGRAMMED TO THE MEMORY CELLS ~ 2400

MAINTAINING A VOLTAGE APPLIED TO ONES OF THE PLURALITY OF BIT LINES AS THE BIT LINE INHIBIT VOLTAGE IN RESPONSE TO THE ONES OF THE PLURALITY OF BIT LINES REMAINING UNSELECTED WHEN PROGRAMMING A NEXT ONE OF THE GROUPS OF THE MEMORY CELLS ~ 2402

*FIG. 24*

ACTIVE CURRENT CONSUMPTION SAVE MODE FOR NON-VOLATILE MEMORY USING FAST PROGRAMMING

CROSS-REFERENCE TO RELATED APPLICATIONS

This application claims the benefit of U.S. Provisional Application No. 63/449,106, filed on Mar. 1, 2023. The entire disclosure of the application referenced above is incorporated herein by reference.

FIELD

This application relates to non-volatile memory apparatuses and the operation of non-volatile memory apparatuses.

BACKGROUND

This section provides background information related to the technology associated with the present disclosure and, as such, is not necessarily prior art.

Semiconductor memory is widely used in various electronic devices such as cellular telephones, digital cameras, personal digital assistants, medical electronics, mobile computing devices, servers, solid state drives, non-mobile computing devices and other devices. Semiconductor memory may comprise non-volatile memory or volatile memory. A non-volatile memory allows information to be stored and retained even when the non-volatile memory is not connected to a source of power (e.g., a battery).

Memory apparatuses consuming less power are typically most desirable, especially for implementations in portable electronic devices; however, various challenges exist in reading and programming data quickly while keeping power consumption as low as possible.

SUMMARY

This section provides a general summary of the present disclosure and is not a comprehensive disclosure of its full scope or all of its features and advantages.

An object of the present disclosure is to provide a memory apparatus and a method of operating the memory apparatus that address and overcome the above-noted shortcomings.

Accordingly, it is an aspect of the present disclosure to provide a memory apparatus including memory cells each connected to one of a plurality of word lines and disposed in memory holes coupled to a plurality of bit lines. The memory cells are each configured to retain a threshold voltage corresponding to one of a plurality of data states. A control means is coupled to the plurality of word lines and the memory holes and is configured to successively apply each of a series of pulses of a program voltage to selected ones of the plurality of word lines while simultaneously applying one of a bit line program voltage and a bit line inhibit voltage to ones of the plurality of bit lines coupled to the memory holes containing groups of the memory cells connected to the selected ones of the plurality of word lines to program the groups of the memory cells with data during a program operation. The bit line program voltage and the bit line inhibit voltage are selected based on the data being programmed to the memory cells. The control means is also configured to maintain a voltage applied to ones of the plurality of bit lines as the bit line inhibit voltage in response to the ones of the plurality of bit lines remaining unselected when programming a next one of the groups of the memory cells.

According to another aspect of the disclosure, a controller in communication with a memory apparatus including memory cells each connected to one of a plurality of word lines is also provided. The memory cells are and disposed in memory holes coupled to a plurality of bit lines and are configured to retain a threshold voltage corresponding to one of a plurality of data states. The controller is configured to instruct the memory apparatus to successively apply each of a series of pulses of a program voltage to selected ones of the plurality of word lines while simultaneously applying one of a bit line program voltage and a bit line inhibit voltage to ones of the plurality of bit lines coupled to the memory holes containing groups of the memory cells connected to the selected ones of the plurality of word lines to program the groups of the memory cells with data during a program operation. The bit line program voltage and the bit line inhibit voltage are selected based on the data being programmed to the memory cells. The controller is also configured to instruct the memory apparatus to maintain a voltage applied to ones of the plurality of bit lines as the bit line inhibit voltage in response to the ones of the plurality of bit lines remaining unselected when programming a next one of the groups of the memory cells.

According to an additional aspect of the disclosure a method of operating a memory apparatus is provided. The memory apparatus includes memory cells each connected to one of a plurality of word lines is also provided. The memory cells are and disposed in memory holes coupled to a plurality of bit lines and are configured to retain a threshold voltage corresponding to one of a plurality of data states. The method includes the step of successively applying each of a series of pulses of a program voltage to selected ones of the plurality of word lines while simultaneously applying one of a bit line program voltage and a bit line inhibit voltage to ones of the plurality of bit lines coupled to the memory holes containing groups of the memory cells connected to the selected ones of the plurality of word lines to program the groups of the memory cells with data during a program operation. The bit line program voltage and the bit line inhibit voltage are selected based on the data being programmed to the memory cells. The method also includes the step of maintaining a voltage applied to ones of the plurality of bit lines as the bit line inhibit voltage in response to the ones of the plurality of bit lines remaining unselected when programming a next one of the groups of the memory cells.

Further areas of applicability will become apparent from the description provided herein. The description and specific examples in this summary are intended for purposes of illustration only and are not intended to limit the scope of the present disclosure.

DRAWINGS

The drawings described herein are for illustrative purposes only of selected embodiments and not all possible implementations, and are not intended to limit the scope of the present disclosure.

FIG. 1A is a block diagram of an example memory device according to aspects of the disclosure;

FIG. 1B is a block diagram of an arrangement of the memory device of FIG. 1A in which a control circuit on a first die communicates with the memory structure on a separate second die according to aspects of the disclosure;

FIG. 9A depicts threshold voltage distributions for an eight-state memory device according to aspects of the disclosure;

FIG. 9B depicts a voltage signal used in a series of program loops in an example program operation which results in the Vth distribution of FIG. 9A according to aspects of the disclosure;

FIG. 10A depicts voltages applied to a selected word line, WLn in a first program loop of a program operation, consistent with FIG. 9B according to aspects of the disclosure;

FIG. 10B depicts a voltage, VWL_unsel, applied to unselected word lines, consistent with FIG. 10A according to aspects of the disclosure;

FIG. 10C depicts a voltage, Vbl_pgm, applied to bit lines of programmed NAND strings, consistent with FIG. 10A according to aspects of the disclosure;

FIG. 10D depicts a voltage, Vbl_inh, applied to bit lines of inhibited NAND strings, consistent with FIG. 10A according to aspects of the disclosure;

FIG. 10E depicts a voltage, Vsgd_sel, applied to SGD transistors of a selected sub-block, consistent with FIG. 10A according to aspects of the disclosure;

FIG. 10F depicts voltages applied to SGD transistors of unselected sub-blocks and to SGS transistors, consistent with FIG. 10A according to aspects of the disclosure;

FIG. 10G depicts a voltage applied to a source line, consistent with FIG. 10A according to aspects of the disclosure;

FIG. 14A shows a plot illustrating pump setting and pump resetting occurring during a sequential program operation according to aspects of the disclosure;

FIG. 14B shows voltages of selected bit lines and word lines during the SLC program operation of FIG. 14A according to aspects of the disclosure;

FIGS. 17A-17C show plots of current consumption versus time for SLC and TLC for different timing of a P5_CLK period according to aspects of the disclosure;

FIG. 23 shows an unselected bit line voltage parameter stored in the memory apparatus according to aspects of the disclosure; and FIGS. 24 and 25 illustrate steps of a method of operating a memory apparatus according to aspects of the disclosure.

To facilitate understanding, identical reference numerals have been used, where possible, to designate identical elements that are common to the figures. It is contemplated that elements disclosed in one embodiment may be beneficially utilized on other embodiments without specific recitation.

DETAILED DESCRIPTION

Figure 2:
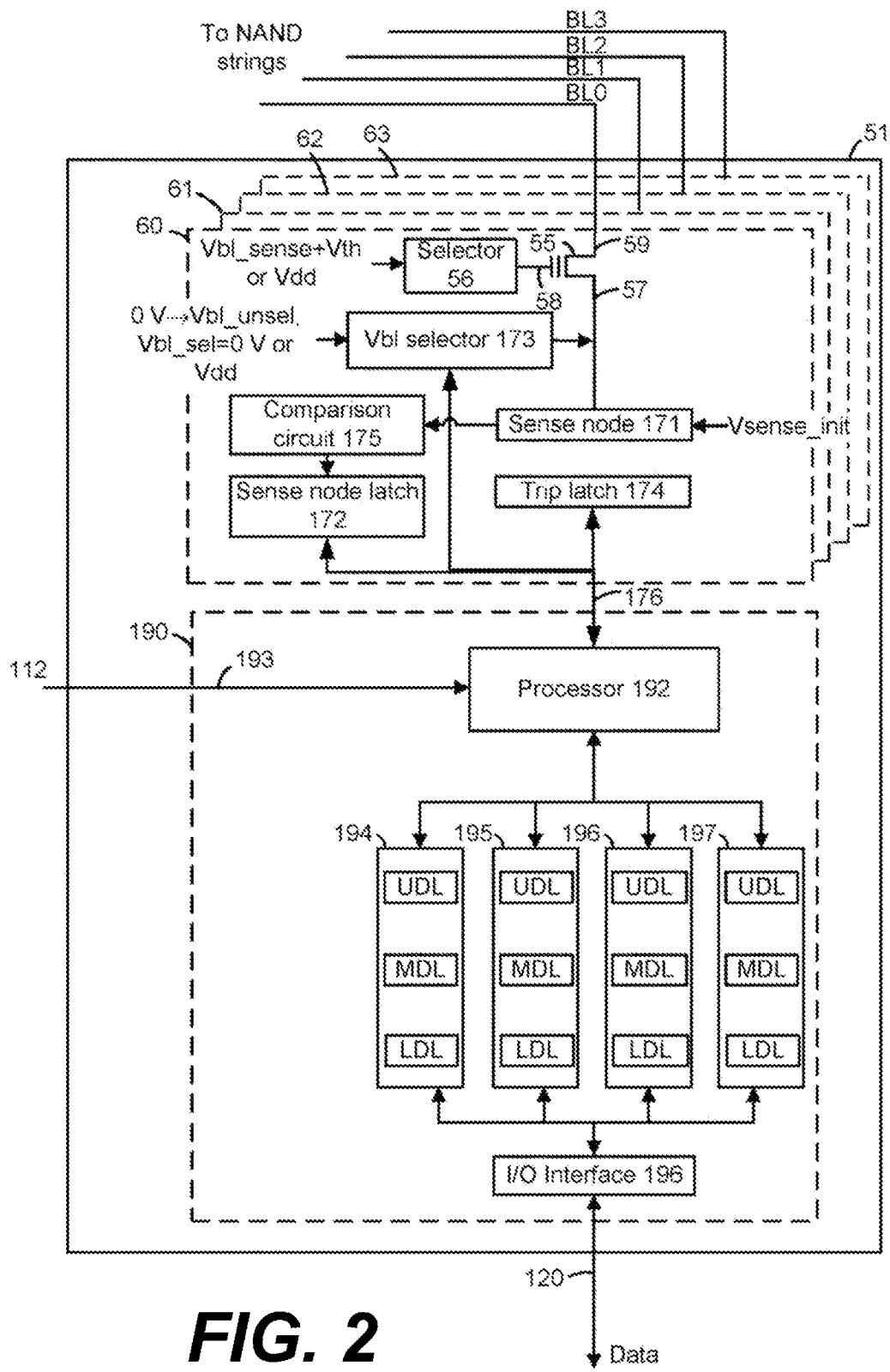
FIG. 2 is a block diagram depicting one embodiment of the sense block of FIG. 1A according to aspects of the disclosure.

In the following description, details are set forth to provide an understanding of the present disclosure. In some instances, certain circuits, structures and techniques have not been described or shown in detail in order not to obscure the disclosure.

In general, the present disclosure relates to non-volatile memory apparatuses of the type well-suited for use in many applications. The non-volatile memory apparatus and associated methods of operation of this disclosure will be described in conjunction with one or more example embodiments. However, the specific example embodiments disclosed are merely provided to describe the inventive concepts, features, advantages and objectives with sufficient clarity to permit those skilled in this art to understand and practice the disclosure. Specifically, the example embodiments are provided so that this disclosure will be thorough, and will fully convey the scope to those who are skilled in the art. Numerous specific details are set forth such as examples of specific components, devices, and methods, to provide a thorough understanding of embodiments of the present disclosure. It will be apparent to those skilled in the art that specific details need not be employed, that example embodiments may be embodied in many different forms and that neither should be construed to limit the scope of the disclosure. In some example embodiments, well-known processes, well-known device structures, and well-known technologies are not described in detail.

In some memory devices, memory cells are connected to one another such as in NAND strings in a block or sub-block. Each NAND string comprises a number of memory cells connected in series between one or more drain end select gate transistors (referred to as SGD transistors), on a drain end of the NAND string which is connected to a bit line, and one or more source end select gate transistors (referred to as SGS transistors), on a source end of the NAND string or other memory string or set of connected memory cells, which is connected to a source line. The select gate transistors are also referred to as select gates. Further, the memory cells can be arranged with a common control gate line (e.g., word line) which acts a control gate. A set of word lines extends from the source-side of a block to the drain-side of a block. See FIG. 8, for example. Memory cells can be connected in other ways as well.

In a 3D memory structure, the memory cells may be arranged in vertical NAND strings in a stack in a substrate, where the stack comprises alternating conductive and dielectric layers. The conductive layers act as word lines which are connected to the memory cells. Each NAND string may have the shape of a pillar which intersects with the word lines to form the memory cells. Further, each NAND string includes various layers which extend vertically in the stack, such as a blocking oxide layer, a charge trapping layer, a tunneling layer and a channel layer. See FIGS. 5 and 6, for example.

In a 2D memory structure, the memory cells may be arranged in horizontal NAND strings on a substrate.

The memory cells can be programmed to have a threshold voltage (Vth) which corresponds to a data state. See FIG. 9A or FIG. 11, for example. The Vth is a function of an amount of charge stored in a charge storing material of the memory cell. A program operation can include a sequence of program loops, where each program loop is performed by applying a program pulse to a selected word line followed by performing one or more verify tests. See FIG. 9B, for example. In particular, a program loop can comprise a pre-charge phase 1090, a program phase 1091, a recovery phase 1092 and a verify phase 1093 as depicted in FIG. 10A. In certain fast programming operations, programming pulses are successively applied without stopping. At the same time program pulses are applied to word lines, bit lines coupled to strings of the memory cells can be raised to a bit line inhibit voltage to prevent programming of the memory cells coupled thereto. Conversely, the bit lines coupled to the strings of the memory cells can be lowered to a bit line program voltage to allow programming of the memory cells coupled thereto. Bit lines are typically ramped down from the bit line inhibit voltage to the bit line program voltage prior to moving onto the next program pulse and must be ramped back up to the bit line inhibit voltage if that bit line remains unselected for the next program pulse. Such ramping down and back up causes an increase in current consumption. Techniques provided herein address this and other issues.

FIG. 1A is a block diagram of an example storage device. The memory device 100, such as a non-volatile storage system, may include one or more memory die 108. The memory die 108, or chip, includes a memory structure 126 of memory cells, such as an array of memory cells, control circuitry 110, and read/write circuits 128. The memory structure 126 is addressable by word lines via a row decoder 124 and by bit lines via a column decoder 132. The read/write circuits 128 include multiple sense blocks 51, 52, . . . 53 (sensing circuitry) and allow a page of memory cells to be read or programmed in parallel. Typically a controller 122 is included in the same memory device 100 (e.g., a removable storage card) as the one or more memory die 108. The controller may be on a die 127 which is separate from the memory die 108. Commands and data are transferred between the host 140 and controller 122 via a data bus 120, and between the controller and the one or more memory die 108 via lines 118.

The memory structure can be 2D or 3D. The memory structure may comprise one or more array of memory cells including a 3D array. The memory structure may comprise a monolithic 3D memory structure in which multiple memory levels are formed above (and not in) a single substrate, such as a wafer, with no intervening substrates. The memory structure may comprise any type of non-volatile memory that is monolithically formed in one or more physical levels of arrays of memory cells having an active area disposed above a silicon substrate. The memory structure may be in a non-volatile memory device having circuitry associated with the operation of the memory cells, whether the associated circuitry is above or within the substrate.

The control circuitry 110 cooperates with the read/write circuits 128 to perform memory operations on the memory structure 126, and includes a state machine, an on-chip address decoder 114, a power control circuit 115, a power on detection circuit 117, a timer 119 and a word line (WL) voltage detection circuit 121. A storage region 113 may be provided, e.g., for operational parameters and software/code. In one embodiment, the state machine is programmable by the software. In other embodiments, the state machine does not use software and is completely implemented in hardware (e.g., electrical circuits).

The on-chip address decoder 114 provides an address interface between that used by the host or a memory controller to the hardware address used by the decoders 124 and 132. The power control circuit 115 controls the power and voltages supplied to the word lines, select gate lines, bit lines and source lines during memory operations. It can include drivers for word lines, SGS and SGD transistors and source lines. See also FIG. 3A. The sense blocks can include bit line drivers, in one approach. The power on detection circuit 117 can detect when the memory device is powered on for use, e.g., based on a power on event. The timer 119 can count an elapsed time since a last sensing operation. The timer may increment based on a clock signal used in the storage device. The WL voltage detection circuit 121 can detect a voltage of a representative word line in a set of word lines. By detecting the actual voltage of a word lines, an accurate determination can be made about whether a set of word lines is in a first, second or intermediate read condition.

The control circuitry 110 may include hardware, software and/or firmware for performing the processes described herein.

In some implementations, some of the components can be combined. In various designs, one or more of the components (alone or in combination), other than memory structure 126, can be thought of as at least one control circuit which is configured to perform the techniques described herein including the steps of the processes described herein. For example, a control circuit may include any one of, or a combination of, control circuitry 110, state machine 112, decoders 114 and 132, power control circuit 115, power on detection circuit 117, timer 119, WL voltage detection circuit 121, sense blocks 51, 52, . . . , 53, read/write circuits 128, controller 122, and so forth. The state machine is an electrical circuit that can control operations of the control circuitry 110. In some embodiments, the state machine is implemented by or replaced by a microprocessor, microcontroller and/or RISC processor.

The off-chip controller 122 (which in one embodiment is an electrical circuit) may comprise a processor 122e, memory such as ROM 122a and RAM 122b and an error-correction code (ECC) engine 245. The ECC engine can correct a number of read errors. The RAM 122b can be a DRAM which stores non-committed data, for example. During programming, a copy of the data to be programmed is stored in the RAM 122b until the programming is successfully completed. In response to the successful completion, the data is erased from the RAM 122b and is committed or released to the block of memory cells. The RAM 122b may store one or more word lines of data.

A memory interface 122d may also be provided. The memory interface, in communication with ROM, RAM and processor, is an electrical circuit that provides an electrical interface between controller and memory die. For example, the memory interface can change the format or timing of signals, provide a buffer, isolate from surges, latch I/O and so forth. The processor can issue commands to the control circuitry 110 (or any other component of the memory die) via the memory interface 122d.

The memory in the controller 122, such as such as ROM 122a and RAM 122b, comprises code such as a set of instructions, and the processor is operable to execute the set of instructions to provide the functionality described herein. Alternatively or additionally, the processor can access code from a subset 126a of the memory structure, such as a reserved area of memory cells in one or more word lines.

For example, code can be used by the controller to access the memory structure such as for programming, read and erase operations. The code can include boot code and control code (e.g., a set of instructions). The boot code is software that initializes the controller during a booting or startup process and enables the controller to access the memory structure. The code can be used by the controller to control one or more memory structures. Upon being powered up, the processor 122e fetches the boot code from the ROM 122a or the subset 126a for execution, and the boot code initializes the system components and loads the control code into the RAM 122b. Once the control code is loaded into the RAM, it is executed by the processor. The control code includes drivers to perform basic tasks such as controlling and allocating memory, prioritizing the processing of instructions, and controlling input and output ports.

The controller, e.g., RAM 122b and/or the control circuitry 110, can store parameters which indicate an expected number of fail bits in a block. These parameters can include, e.g., the number of bits per cell stored in the memory cells, a portion of the word lines which are programmed in a block or sub-block, a portion of the sub-blocks which are programmed in a block, a strength of an ECC process used to store and read data in the block, a duration of pre-read voltage pulse, if used, and a read accuracy, such as a bit line or word line voltage settling time and a number of sensing passes.

Generally, the control code can include instructions to perform the functions described herein including the steps of the flowcharts discussed further below, and provide the voltage signals including those discussed further below. A control circuit can be configured to execute the instructions to perform the functions described herein.

In one embodiment, the host is a computing device (e.g., laptop, desktop, smartphone, tablet, digital camera) that includes one or more processors, one or more processor readable memory devices (RAM, ROM, flash memory, hard disk drive, solid state memory) that store processor readable code (e.g., software) for programming the one or more processors to perform the methods described herein. The host may also include additional system memory, one or more input/output interfaces and/or one or more input/output devices in communication with the one or more processors.

Other types of non-volatile memory in addition to NAND flash memory can also be used.

Semiconductor memory devices include volatile memory devices, such as dynamic random access memory (DRAM) or static random access memory (SRAM) devices, non-volatile memory devices, such as resistive random access memory (ReRAM), electrically erasable programmable read-only memory (EEPROM), flash memory (which can also be considered a subset of EEPROM), ferroelectric random access memory (FRAM), and magnetoresistive random access memory (MRAM), and other semiconductor elements capable of storing information. Each type of memory device may have different configurations. For example, flash memory devices may be configured in a NAND or a NOR configuration.

The memory devices can be formed from passive and/or active elements, in any combinations. By way of non-limiting example, passive semiconductor memory elements include ReRAM device elements, which in some embodiments include a resistivity switching storage element, such as an anti-fuse or phase change material, and optionally a steering element, such as a diode or transistor. Further by way of non-limiting example, active semiconductor memory elements include EEPROM and flash memory device elements, which in some embodiments include elements containing a charge storage region, such as a floating gate, conductive nanoparticles, or a charge storage dielectric material.

Multiple memory elements may be configured so that they are connected in series or so that each element is individually accessible. By way of non-limiting example, flash memory devices in a NAND configuration (NAND memory) typically contain memory elements connected in series. A NAND string is an example of a set of series-connected transistors comprising memory cells and SG transistors.

A NAND memory array may be configured so that the array is composed of multiple strings of memory in which a string is composed of multiple memory elements sharing a single bit line and accessed as a group. Alternatively, memory elements may be configured so that each element is individually accessible, e.g., a NOR memory array. NAND and NOR memory configurations are examples, and memory elements may be otherwise configured.

The semiconductor memory elements located within and/or over a substrate may be arranged in two or three dimensions, such as a 2D memory structure or a 3D memory structure.

In a 2D memory structure, the semiconductor memory elements are arranged in a single plane or a single memory device level. Typically, in a 2D memory structure, memory elements are arranged in a plane (e.g., in an x-y direction plane) which extends substantially parallel to a major surface of a substrate that supports the memory elements. The substrate may be a wafer over or in which the layer of the memory elements are formed or it may be a carrier substrate which is attached to the memory elements after they are formed. As a non-limiting example, the substrate may include a semiconductor such as silicon.

The memory elements may be arranged in the single memory device level in an ordered array, such as in a plurality of rows and/or columns. However, the memory elements may be arrayed in non-regular or non-orthogonal configurations. The memory elements may each have two or more electrodes or contact lines, such as bit lines and word lines.

A 3D memory array is arranged so that memory elements occupy multiple planes or multiple memory device levels, thereby forming a structure in three dimensions (i.e., in the x, y and z directions, where the z direction is substantially perpendicular and the x and y directions are substantially parallel to the major surface of the substrate).

As a non-limiting example, a 3D memory structure may be vertically arranged as a stack of multiple 2D memory device levels. As another non-limiting example, a 3D memory array may be arranged as multiple vertical columns (e.g., columns extending substantially perpendicular to the major surface of the substrate, i.e., in the y direction) with each column having multiple memory elements. See an example column in FIG. 5. The columns may be arranged in a 2D configuration, e.g., in an x-y plane, resulting in a 3D arrangement of memory elements with elements on multiple vertically stacked memory planes. Other configurations of memory elements in three dimensions can also constitute a 3D memory array.

By way of non-limiting example, in a 3D NAND memory array, the memory elements may be coupled together to form a NAND string within a single horizontal (e.g., x-y) memory device level. Alternatively, the memory elements may be coupled together to form a vertical NAND string that traverses across multiple horizontal memory device levels. Other 3D configurations can be envisioned wherein some NAND strings contain memory elements in a single memory level while other strings contain memory elements which span through multiple memory levels. 3D memory arrays may also be designed in a NOR configuration and in a ReRAM configuration.

Typically, in a monolithic 3D memory array, one or more memory device levels are formed above a single substrate. Optionally, the monolithic 3D memory array may also have one or more memory layers at least partially within the single substrate. As a non-limiting example, the substrate may include a semiconductor such as silicon. In a monolithic 3D array, the layers constituting each memory device level of the array are typically formed on the layers of the underlying memory device levels of the array. However, layers of adjacent memory device levels of a monolithic 3D memory array may be shared or have intervening layers between memory device levels.

2D arrays may be formed separately and then packaged together to form a non-monolithic memory device having multiple layers of memory. For example, non-monolithic stacked memories can be constructed by forming memory levels on separate substrates and then stacking the memory levels atop each other. The substrates may be thinned or removed from the memory device levels before stacking, but as the memory device levels are initially formed over separate substrates, the resulting memory arrays are not monolithic 3D memory arrays. Further, multiple 2D memory arrays or 3D memory arrays (monolithic or non-monolithic) may be formed on separate chips and then packaged together to form a stacked-chip memory device.

Associated circuitry is typically required for operation of the memory elements and for communication with the memory elements. As non-limiting examples, memory devices may have circuitry used for controlling and driving memory elements to accomplish functions such as programming and reading. This associated circuitry may be on the same substrate as the memory elements and/or on a separate substrate. For example, a controller for memory read-write operations may be located on a separate controller chip and/or on the same substrate as the memory elements.

One of skill in the art will recognize that this technology is not limited to the 2D and 3D exemplary structures described but covers all relevant memory structures within the spirit and scope of the technology as described herein and as understood by one of skill in the art.

FIG. 1B is a block diagram of an arrangement of the memory device 100 of FIG. 1A in which a control circuit 130 on a first die 130a communicates with the memory structure 126 on a separate second die 126b. The control circuit may communicate with the memory structure and the die 126b via a memory interface 131, for example, similar to the memory interface 122d. Examples of a memory interface (I/F) include the Common Flash Memory Interface of JEDEC. The techniques described herein can be implemented with a control die 130a bonded to one or more memory die 126b, where the memory die includes the memory structure 126 and the control die includes a control circuit 130 representing all, or subset, of the peripheral circuits of the memory structure. The control circuit can be on the same die as the plurality of memory cells, or on a different die than the plurality of memory cells.

For example, the memory structure may contain non-volatile memory cells. In some embodiments, the memory die and the control die are bonded together. The control circuit 130 can comprise a set of electrical circuits that perform memory operations (e.g., write, read, erase and others) on the memory structure. The control circuit can include the state machine 112, storage region 113, on-chip address decoder 114 and power control circuit 115. In another embodiment, one portion of the read/write circuits 128 are located on the control die 130a and another portion of the read/write circuits are located on memory die 126b. For example, the read/write circuits may contain sense amplifiers. The sense amplifiers can be located on the control die and/or the memory die.

In an example implementation, the control circuit 130 is configured to connect to a NAND string and a substrate, and the memory interface 131 is connected to the control circuit. The circuit can be configured to issue command via the memory interface to apply different voltage signals to bit lines, word lines, select gate lines, and a CELSRC line (source line), for example.

The term "memory die" can refer to a semiconductor die that contains non-volatile memory cells for storage of data. The term, "control circuit die" can refer to a semiconductor die that contains control circuitry for performing memory operations on non-volatile memory cells on a memory die. Typically, numerous semiconductor die are formed from a single semiconductor wafer.

FIG. 2 is a block diagram depicting one embodiment of the sense block 51 of FIG. 1A. An individual sense block 51 is partitioned into one or more core portions, referred to as sense circuits 60-63 or sense amplifiers, and a common portion, referred to as a managing circuit 190. In one embodiment, each sense circuit is connected to a respective bit line which in turn is connected to one or more NAND strings. For example, in a configuration consistent with FIG. 8, each bit line is connected to four NAND strings, with one NAND string per sub-block. A common managing circuit 190 is connected to a set of multiple, e.g., four or eight, sense circuits. Each of the sense circuits in a group communicates with the associated managing circuit via data bus 176. Thus, there are one or more managing circuits which communicate with the sense circuits of a set of storage elements (memory cells).

The sense circuit 60, as an example, operates during a program loop to provide a pre-charge/program-inhibit voltage to an unselected bit line or a program-enable voltage to a selected bit line. An unselected bit line is connected to an unselected NAND string and to an unselected memory cell therein. An unselected memory cell can be a memory cell in an unselected NAND string, where the memory cell is connected to a selected or unselected word line. An unselected memory cell can also be a memory cell in a selected NAND string, where the memory cell is connected to an unselected word line. A selected bit line is connected to a selected NAND string and to a selected memory cell therein.

The sense circuit 60 also operates during a verify test in a program loop to sense a memory cell to determine whether it has completed programming by reaching an assigned data state, e.g., as indicated by its Vth exceeding the verify voltage of the assigned data state. The sense circuit 60 also operates during a read operation to determine the data state to which a memory cell has been programmed. The sense circuit 60 also operates in an erase operation during a verify test to determine whether a plurality of memory cells have a Vth below a verify voltage. As described further below, a verify test can be performed for the memory cells connected to all of the word lines in a block, or to memory cells connected to odd- or even-numbered word lines. The sense circuit performs sensing by determining whether a conduction current in a connected bit line is above or below a predetermined threshold level. This indicates whether the Vth of the memory cell is below or above, respectively, the word line voltage.

The sense circuit may include a selector 56 or switch connected to a transistor 55 (e.g., an nMOS). Based on voltages at the control gate 58 and drain 57 of the transistor 55, the transistor can operate as a pass gate or as a bit line clamp. When the voltage at the control gate is sufficiently higher than the voltage on the drain, the transistor operates as a pass gate to pass the voltage at the drain to the bit line (BL) at the source 59 of the transistor. For example, a program-inhibit voltage such as 1-2 V may be passed when pre-charging and inhibiting an unselected NAND string. Or, a program-enable voltage such as 0 V may be passed to allow programming in a selected NAND string. The selector 56 may pass a power supply voltage Vdd, e.g., 3-4 V to the control gate of the transistor 55 to cause it to operate as a pass gate.

When the voltage at the control gate is lower than the voltage on the drain, the transistor 55 operates as a source-follower to set or clamp the bit line voltage at Vcg–Vth, where Vcg is the voltage on the control gate 58 and Vth, e.g., 0.7 V, is the threshold voltage of the transistor 55. This assumes the source line is at 0 V. If Vcelsrc is non-zero, the bit line voltage is clamped at Vcg–Vcelsrc–Vth. The transistor is therefore sometimes referred to as a bit line clamp (BLC) transistor, and the voltage Vcg on the control gate 58 is referred to as a bit line clamp voltage, Vblc. This mode can be used during sensing operations such as read and verify operations. The bit line voltage is thus set by the transistor 55 based on the voltage output by the selector 56. For example, the selector 56 may pass Vbl_sense+Vth, e.g., 1.5 V, to the control gate of the transistor 55 to provide Vbl_sense, e.g., 0.8 V, on the bit line. A Vbl selector 173 may pass a relatively high voltage such as Vdd to the drain 57, which is higher than the control gate voltage on the transistor 55, to provide the source-follower mode during sensing operations. Vbl refers to the bit line voltage.

The Vbl selector 173 can pass one of a number of voltage signals. For example, the Vbl selector can pass a program-inhibit voltage signal which increases from an initial voltage, e.g., 0 V, to a program inhibit voltage, e.g., Vbl_inh for respective bit lines of unselected NAND string during a program loop. The Vbl selector 173 can pass a program-enable voltage signal such as 0 V for respective bit lines of selected NAND strings during a program loop. The Vbl selector may select a voltage signal from the BL voltage driver 340 in FIG. 3A based on commands from the processor 192, for example.

In one approach, the selector 56 of each sense circuit can be controlled separately from the selectors of other sense circuits. The Vbl selector 173 of each sense circuit can also be controlled separately from the Vbl selectors of other sense circuits During sensing, a sense node 171 is charged up to an initial voltage, Vsense_init, such as 3 V. The sense node is then passed to the bit line via the transistor 55, and an amount of decay of the sense node is used to determine whether a memory cell is in a conductive or non-conductive state. The amount of decay of the sense node also indicates whether a current Icell in the memory cell exceeds a reference current, Iref. If Icell<=Iref, the memory cell is in a non-conductive state and if Icell>Iref, the memory cell is in a conductive state.

In particular, the comparison circuit 175 determines the amount of decay by comparing the sense node voltage to a trip voltage at a sense time. If the sense node voltage decays below the trip voltage, Vtrip, the memory cell is in a conductive state and its Vth is at or below the verify voltage. If the sense node voltage does not decay below Vtrip, the memory cell is in a non-conductive state and its Vth is above the verify voltage. A sense node latch 172 is set to 0 or 1, for example, by the comparison circuit 175 based on whether the memory cell is in a conductive or non-conductive state, respectively. The data in the sense node latch can be a bit which is read out by the processor 192 and used to update a trip latch 174. Subsequently, for a next program loop, a bit in the trip latch can be used by the processor, along with the assigned data state in the latches 194-197 to determine whether a memory cell and NAND string are selected or unselected for programming in the program loop, and to thereby pass the appropriate enable or inhibit bit line voltage, respectively, to the bit line. The latches 194-197 may be considered to be data latches or user data latches because they store the data to be programmed into the memory cells.

The managing circuit 190 comprises a processor 192, four example sets of data latches 194-197 for the sense circuits 60-63, respectively, and an I/O interface 196 coupled between the sets of data latches and the data bus 120. One set of three data latches, e.g., comprising individual latches LDL, MDL and UDL, can be provided for each sense circuit. In some cases, a different number of data latches may be used. In a three bit per cell embodiment, LDL stores a bit for a lower page of data, MDL stores a bit for a middle page of data and UDL stores a bit for an upper page of data.

The processor 192 performs computations, such as to determine the data stored in the sensed memory cell and store the determined data in the set of data latches. Each set of data latches 194-197 is used to store data bits determined by processor 192 during a read operation, and to store data bits imported from the data bus 120 during a program operation which represent write data meant to be programmed into the memory. I/O interface 196 provides an interface between data latches 194-197 and the data bus 120.

During reading, the operation of the system is under the control of state machine 112 that controls the supply of different control gate voltages to the addressed memory cell. As it steps through the various predefined control gate voltages corresponding to the various memory states supported by the memory, the sense circuit may trip at one of these voltages and a corresponding output will be provided from sense circuit to processor 192 via the data bus 176. At that point, processor 192 determines the resultant memory state by consideration of the tripping event(s) of the sense circuit and the information about the applied control gate voltage from the state machine via input lines 193. It then computes a binary encoding for the memory state and stores the resultant data bits into data latches 194-197.

Some implementations can include multiple processors 192. In one embodiment, each processor 192 will include an output line (not depicted) such that each of the output lines is connected in a wired-OR connection. A wired OR connection or line can be provided by connecting multiple wires together at a node, where each wire carries a high or low input signal from a respective processor, and an output of the node is high if any of the input signals is high. In some embodiments, the output lines are inverted prior to being connected to the wired-OR line. This configuration enables a quick determination during a program verify test of when the programming process has completed because the state machine receiving the wired-OR can determine when all bits being programmed have reached the desired level. For example, when each bit has reached its desired level, a logic zero for that bit will be sent to the wired-OR line (or a data one is inverted). When all bits output a data 0 (or a data one inverted), then the state machine knows to terminate the programming process. Because each processor communicates with eight sense circuits, the state machine needs to read the wired-OR line eight times, or logic is added to processor 192 to accumulate the results of the associated bit lines such that the state machine need only read the wired-OR line one time. Similarly, by choosing the logic levels correctly, the global state machine can detect when the first bit changes its state and change the algorithms accordingly.

During program or verify operations for memory cells, the data to be programmed (write data) is stored in the set of data latches 194-197 from the data bus 120. During reprogramming, a respective set of data latches of a memory cell can store data indicating when to enable the memory cell for reprogramming based on the program pulse magnitude.

The program operation, under the control of the state machine, applies a series of programming voltage pulses to the control gates of the addressed memory cells. Each voltage pulse may be stepped up in magnitude from a previous program pulse by a step size in a processed referred to as incremental step pulse programming. Each program voltage is followed by a verify operation to determine if the memory cells has been programmed to the desired memory state. See also FIG. 9B. In some cases, processor 192 monitors the read back memory state relative to the desired memory state. When the two are in agreement, the processor 192 sets the bit line in a program inhibit mode such as by updating its latches. This inhibits the memory cell coupled to the bit line from further programming even if additional program pulses are applied to its control gate.

Each set of data latches 194-197 may be implemented as a stack of data latches for each sense circuit. In one embodiment, there are three data latches per sense circuit 60. In some implementations, the data latches are implemented as a shift register so that the parallel data stored therein is converted to serial data for data bus 120, and vice versa. All the data latches corresponding to the read/write block of memory cells can be linked together to form a block shift register so that a block of data can be input or output by serial transfer. In particular, the bank of read/write circuits is adapted so that each of its set of data latches will shift data in to or out of the data bus in sequence as if they are part of a shift register for the entire read/write block.

The data latches identify when an associated memory cell has reached certain mileposts in a program operations. For example, latches may identify that a memory cell's Vth is below a particular verify voltage. The data latches indicate whether a memory cell currently stores one or more bits from a page of data. For example, the LDL latches can be used to store a lower page of data. An LDL latch is flipped (e.g., from 0 to 1) when a lower page bit is stored in an associated memory cell. For three bits per cell, an MDL or UDL latch is flipped when a middle or upper page bit, respectively, is stored in an associated memory cell. This occurs when an associated memory cell completes programming.

Figure 3A:
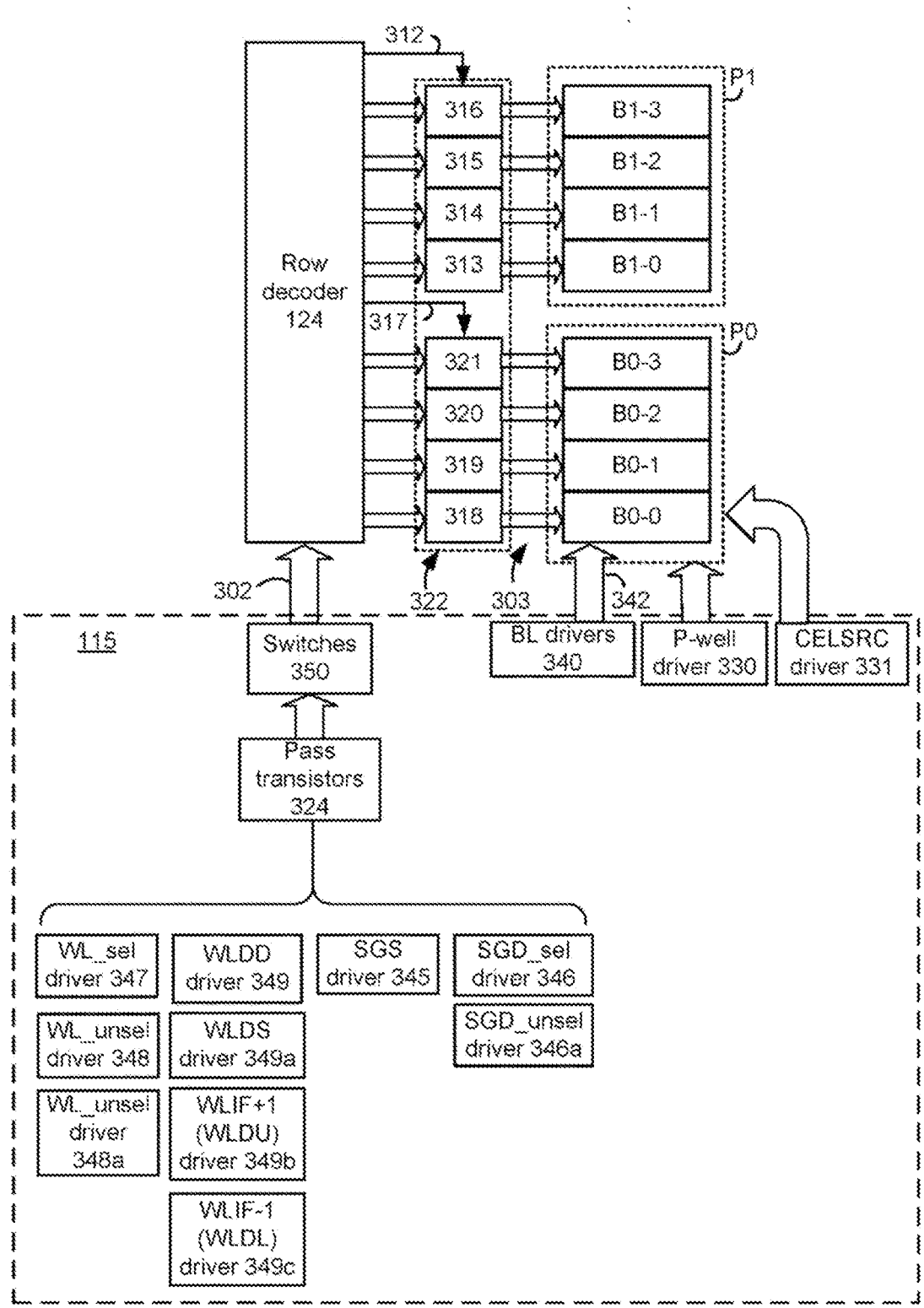
FIG. 3A depicts an example implementation of the power control circuit of FIG. 1A for providing voltages to blocks of memory cells according to aspects of the disclosure.
Figure 8:
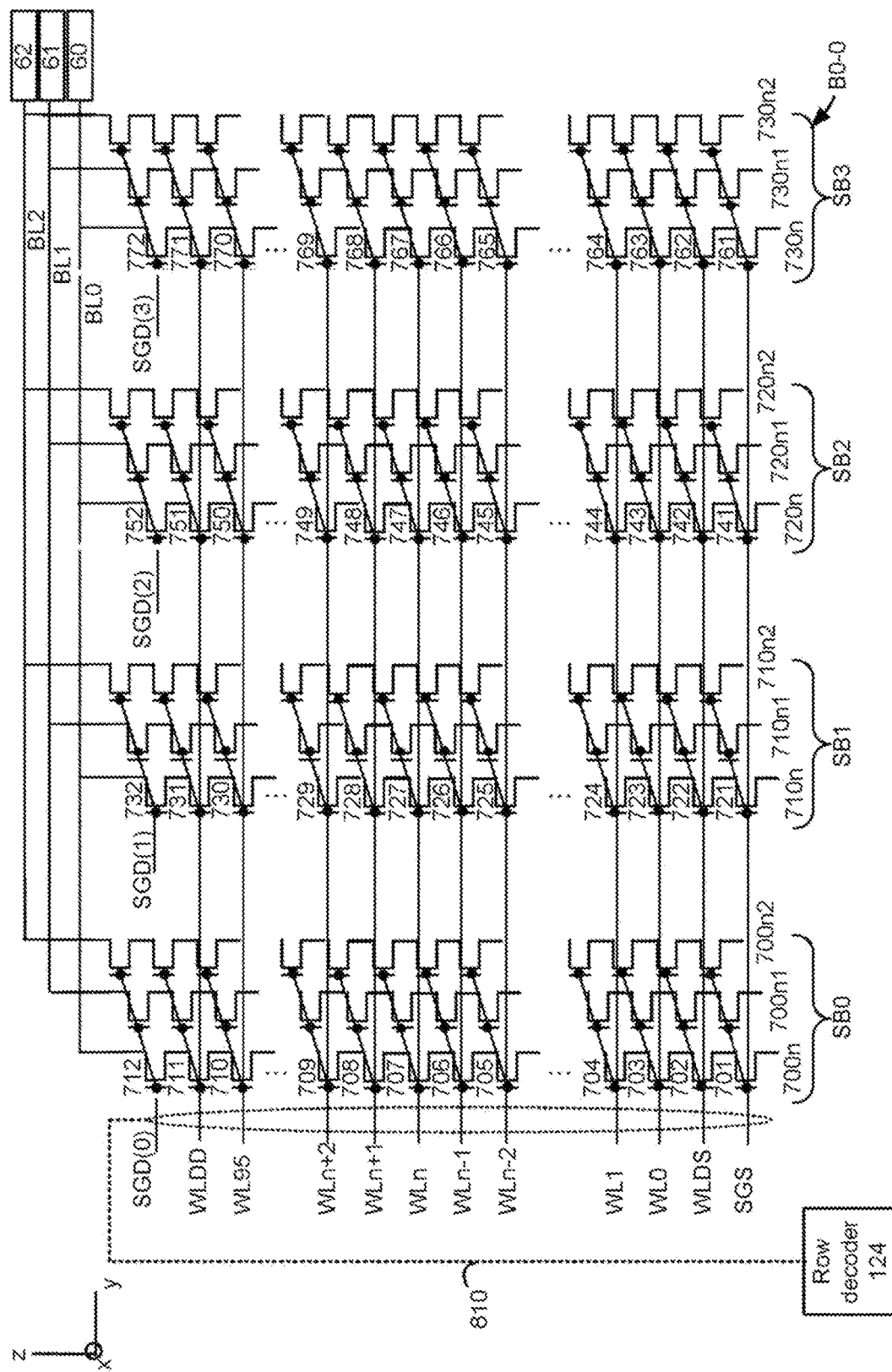
FIG. 8 depicts an example view of the block B0-0 of FIG. 4, with respective NAND strings arranged in sub-blocks, along with associated bit lines and sense circuits according to aspects of the disclosure.

FIG. 3A depicts an example implementation of the power control circuit 115 of FIG. 1A for providing voltages to blocks of memory cells. The circuitry shown can be repeated for each plane of a die, in one approach. In this example, the memory structure 126 includes a set of four blocks, B0-0 to B0-3, in one plane, P0, and another set of four blocks, B1-0 to B1-3, in another plane, P1, consistent with FIG. 4. Generally, the blocks can be in one or more planes. The row decoder 124 of FIG. 1A provides voltages to word lines and select gate control lines of each block via pass transistors 322. In one approach, a separate row decoder is provided for each block. The row decoder can be provided one side of a block, such as depicted in FIG. 8. The row decoder provides a control signal to pass transistors which connect the blocks to the row decoder. In one approach, the pass transistors of each set of blocks are controlled by a common control gate voltage. Thus, the pass transistors for a set of block are either all on or off at a given time. If the pass transistors are on, a voltage from the row decoder is provided to the respective control gate lines or word lines. If the pass transistors are off, the row decoder is disconnected from the respective control gate lines or word lines so that the voltage floats on the respective control gate lines or word lines.

For instance, a block enable line 312 is connected to sets of pass transistors 313-316, which in turn are connected to select gate and word lines of B1-0 to B1-3, respectively. A block enable line 317 is connected to sets of pass transistors 318-321, which in turn are connected to select gate and word lines of B0-0 to B0-3, respectively. The control signal on the block enable line 317 is therefore an enable signal for a set of blocks B0-0 to B0-3, and the control signal on the block enable line 312 is an enable signal for a set of blocks B1-0 to B1-3.

Typically, program or read operations are performed on one selected sub-block at a time in a block. An erase operation may be performed on a selected block or sub-block. The row decoder can connect global control lines 302 to local control lines 303. The control lines represent conductive paths. Voltages are provided on the global control lines from a number of voltage drivers. Some of the voltage drivers may provide voltages to switches 350 which connect to the global control lines. Pass transistors 324 are controlled to pass voltages from the voltage drivers to the switches 350.

A number of voltage drivers can be provided that are connected to the pass transistors. For example, a selected data word line driver, WL_sel driver 347, provides a voltage signal on a data word line which is selected during a program or read operation. In one approach, the WL_unsel driver 348 provides a common voltage signal on each of unselected data word lines. In another approach, multiple drivers can be used to provide different voltage signals on different groups of unselected word lines. For example, the WL_unsel driver 348 can provide a voltage signal to one group of unselected word lines, and the additional WL_unsel driver 348a can provide a voltage signal to another group of unselected word lines. In one approach, the another group of unselected word lines receives a delayed version of a voltage signal provided to the one group of unselected word lines.

In some cases, additional drivers are provided for the WLn−1 and WLn+1, the adjacent word lines of WLn.

Dummy word line drivers are also provided. The WLDD driver 349 provides a voltage signal on the drain-side dummy word line, WLDD, and the WLDS driver 349a provides a voltage signal on the source-side dummy word line, WLDS. Moreover, in the case of a two-tier stack, as in FIG. 7, where a bottom tier is separated from a top tier by an interface, a WLIF+1 (WLDU) driver 349b can be used to apply a voltage to the word line adjacent to and above the interface, and a WLIF−1 (WLDL) driver 349c can be used to apply a voltage to the word line adjacent to and below the interface. WLDL is the last word line of the bottom tier and WLDU is the first word line of the top tier.

The voltage drivers can also include an SGS driver 345 which is common to the different sub-blocks in a block, in one example. This driver provides a voltage signal to a control line connected to the control gates of the SGS transistors (source-side select gate transistors). In another option, a separate SGS driver is provided for each sub-block.

The voltage drivers can also include a SGD_sel driver 346 for the SGD transistors of a selected sub-block of a block involved in an operation, and a SGD_unsel driver 346a for the SGD transistors of unselected sub-blocks of the block. In another option, a separate SGD driver is provided for each sub-block. The SGD drivers provide a voltage to a control line connected to the control gates of an SGD transistor (drain-side select gate transistor).

The various components, including the row decoder, may receive commands from a controller such as the state machine 112 or the controller 122 to perform the functions described herein.

The p-well voltage driver 330 provides a voltage Vp-well to the p+ contact 524 in the p-well region 592, e.g., via the conductive path 524 a. See FIG. 5. In one approach, the p-well region 592 is common to a set of blocks. A set of bit lines 342 is also shared by the blocks. A source line voltage driver, referred to as a CELSRC driver 331, provides a voltage Vcelsrc to a source end of a NAND string. For example, Vcelsrc can be provided to the n+ contact 523 in the p-well region 592, e.g., via the local interconnect 523a in FIG. 5.

Bit line voltage drivers 340 include voltage sources which provide voltages to the bit lines 342. The bit line voltage for sensing can be 0.5 V, for example.

Figure 3B:
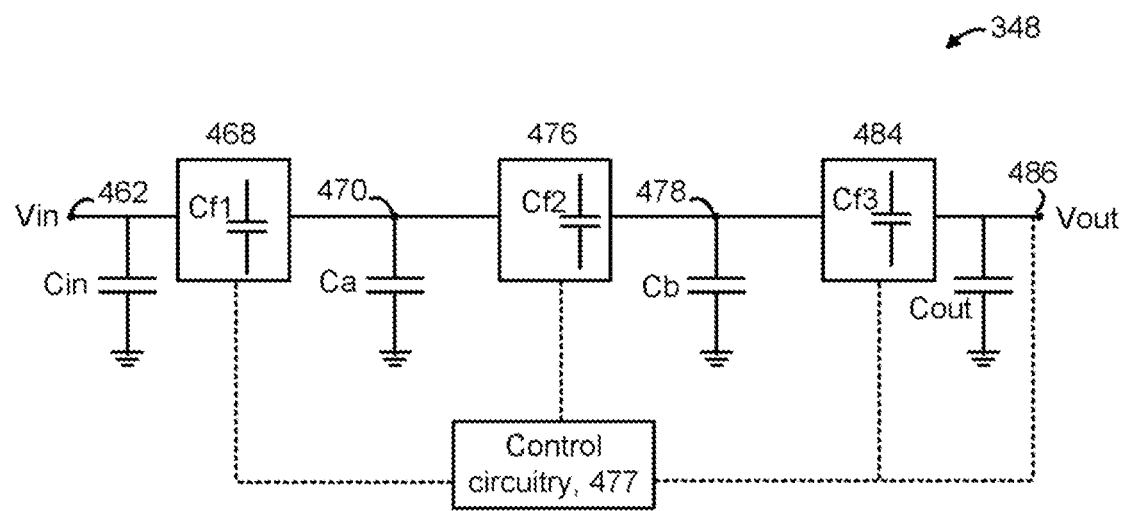
FIG. 3B depicts an example implementation of the WL_unsel driver of FIG. 3A as a multi-stage charge pump according to aspects of the disclosure.

FIG. 3B depicts an example implementation of the WL_unsel driver 348 of FIG. 3A as a multi-stage charge pump. A charge pump is an example of a voltage driver which can provide a higher output voltage than its input voltage. Vin is provided at input node 462 and Vout is obtained at an output node 486. For example, Vin may be a fixed power supply voltage sometimes referred to as Vdd in a semiconductor chip. Vout could be a word line voltage, for instance.

As an example, three stages 468, 476 and 484 are provided. Each stage 468, 476 and 484 can include switches and one or more flying capacitors Cf1, Cf2 and Cf3, respectively, such as a MOS (metal oxide semiconductor) capacitor. At the node 462, charge from the input voltage is maintained in an input capacitor Cin which is connected to a ground node. At a node 470 which is between the first stage 468 and the second stage 476, a capacitor Ca is connected to a ground node. At a node 478 which is between the second stage 476 and the third stage 484, a capacitor Cb is connected to a ground node. Finally, at the output node 486, an output capacitor Cout is connected to a ground node. A multi-stage charge pump can provide greater flexibility in terms of providing a high output voltage and a greater range of output voltages, compared to a single stage charge pump. Further, each stage can include one or more capacitors to provide even greater flexibility.

The multi-stage charge pump 348 is operated by control circuitry 477 which controls switching in each stage. The switches may be MOSFETs, bipolar junction transistors or relay switches, for instance.

Based on the switching, charge is transferred from the input node 462 of the first stage to Cf1, and from Cf1 to the node 470. Charge is then transferred from the node 470 of the second stage to Cf2 in the second stage, and from Cf2 to the node 478. Charge is then transferred from the node 478 to Cf3 in the third stage, and from Cf3 to the output node 486.

Generally, each stage of the charge pump operation includes two main phases: charging the flying capacitor from the input node, and discharging the flying capacitor into the output node. During each phase, some switches are closed (conductive), connecting the flying capacitor to either the input node, the output node, or a ground node. The control circuitry 477 may communicate with the output node 486 as well such as to detect its level and to make adjustments in the charge pump. For example, a switching frequency can be reduced if Vout is above a target voltage, or increased if Vout is below the target voltage. As discussed further in connection with FIGS. 3C and 3D, Vout is proportional to the switching frequency.

Note that the circuits shown are examples only, as various modifications can be made. Other types of voltage driver circuits could be used as well.

Figure 3C:
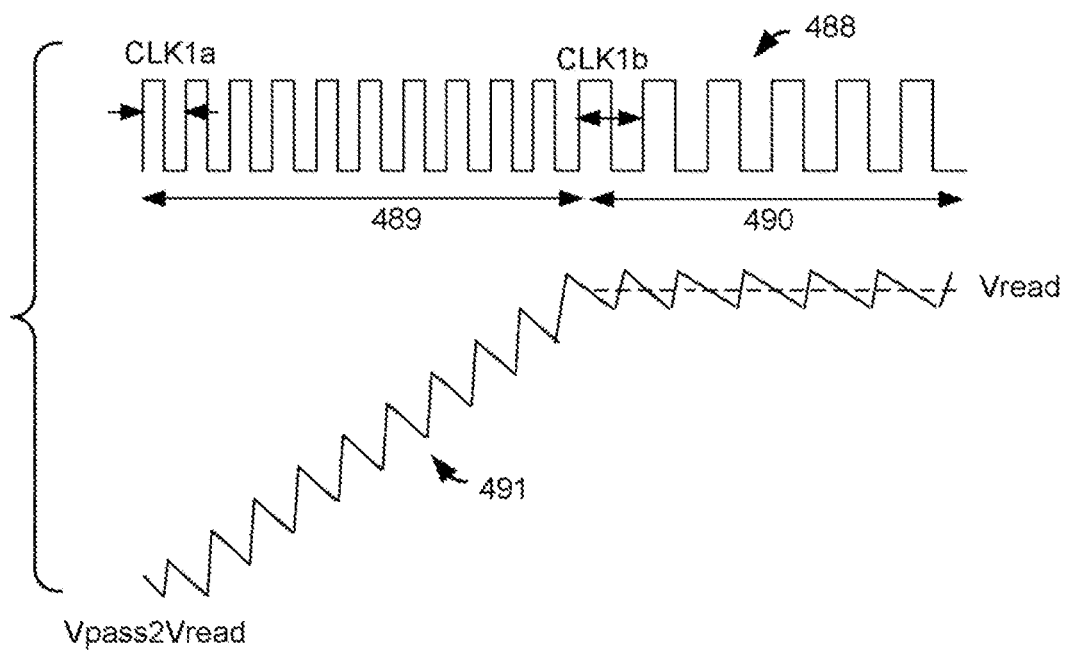
FIG. 3C depicts an example clock signal and output voltage of the charge pump of FIG. 3B where a lower ramp up rate is used according to aspects of the disclosure.
Figure 3D:
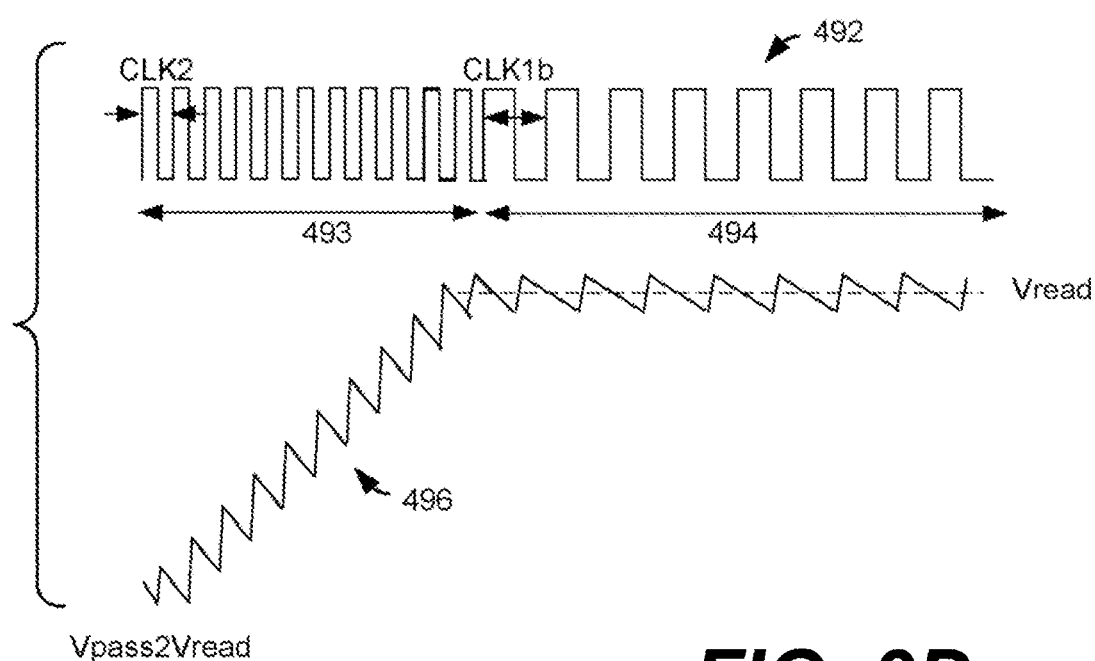
FIG. 3D depicts an example clock signal and output voltage of the charge pump of FIG. 3B where a higher ramp up rate is used according to aspects of the disclosure.

FIGS. 3C and 3D depicts two example clock signals that are used to achieve different ramp rates for the charge pump of FIG. 3A. FIG. 3C depicts an example clock signal 488 and output voltage 491 of the charge pump of FIG. 3B where a lower ramp up rate (Rlow) is used, e.g., lower relative to the example of FIG. 3D. The clock signal is provided by the control circuitry 477 to activate switches in the stages of the charge pump. The output voltage increases with each charge period, starting from Vpass2Vread and ending at Vread, for example, e.g., 8-10 V. The output voltage has a ripple shape due to the repeated charging and discharging of the capacitors in the charge pump. The clock signal has period CLK1$a$ in a time period 489 in which the output voltage increases. The clock signal then changes to have a period CLK1$b$>CLK1$a$ in a time period 490 when the output voltage reaches Vread, and the output voltage subsequently remains at Vread. The output voltage can return to 0 V or other initial level at a designated time.

FIG. 3D depicts an example clock signal 492 and output voltage 496 of the charge pump of FIG. 3B where a higher ramp up rate (Rhigh) is used, relative to the example of FIG. 3C. The output voltage increases with each charge period, starting from 0 V and ending at Vread, for example. The clock signal has period CLK2<CLK1$a$ in a time period 493 in which the output voltage increases. The clock signal then changes to have the period CLK1$b$>CLK2, as in FIG. 3C, in a time period 494 when the output voltage reaches Vread, and the output voltage subsequently remains at Vread.

Figure 4:
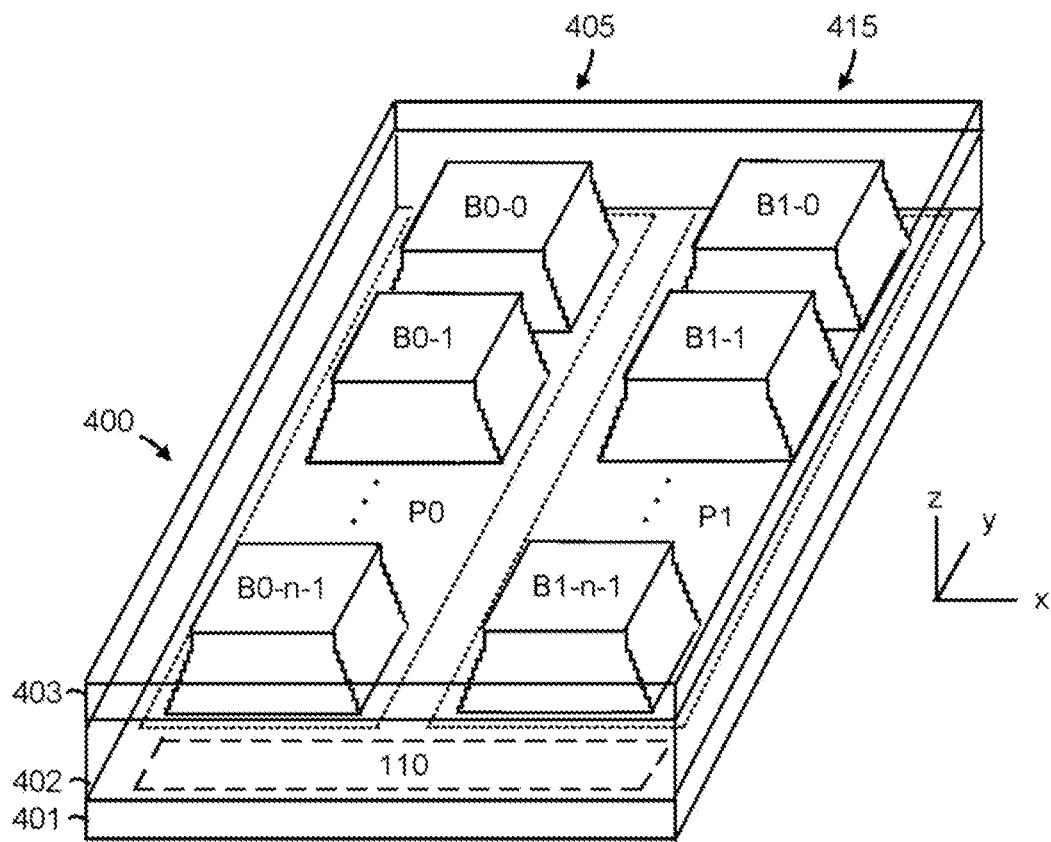
FIG. 4 is a perspective view of an example memory die in which blocks are provided in respective planes P0 and P1, consistent with FIG. 3A according to aspects of the disclosure.

FIG. 4 is a perspective view of an example memory die 400 in which blocks are provided in respective planes P0 and P1, consistent with FIG. 3A. The memory die includes a substrate 401, an intermediate region 402 in which blocks of memory cells are formed, and an upper region 403 in which one or more upper metal layers are patterned such as to form bit lines. Planes P0 and P1 represent respective isolation regions which are formed in the substrate 401. Further, a first block sequence 405 of a number n blocks, labelled B0-0 to B0-$n$–1, are formed in P0, and a second block sequence 415 of a number n blocks, labelled B1-0 to B1-$n$–1, are formed in P1. Each plane may have associated row and column control circuitry, such as the row decoder 124, read/write circuits 128 and column decoder 132 of FIG. 1A.

The control circuitry 110, which may be located in a peripheral area of the die, may be shared among the planes, in one approach. Each plane may have a separate set of bit lines.

By providing blocks of memory cells in multiple planes, parallel operations can be performed in the planes. For example, blocks in a different planes can be erased concurrently.

The substrate 401 can also carry circuitry under the blocks, and one or more lower metal layers which are patterned in conductive paths to carry signals of the circuitry.

Figure 5:
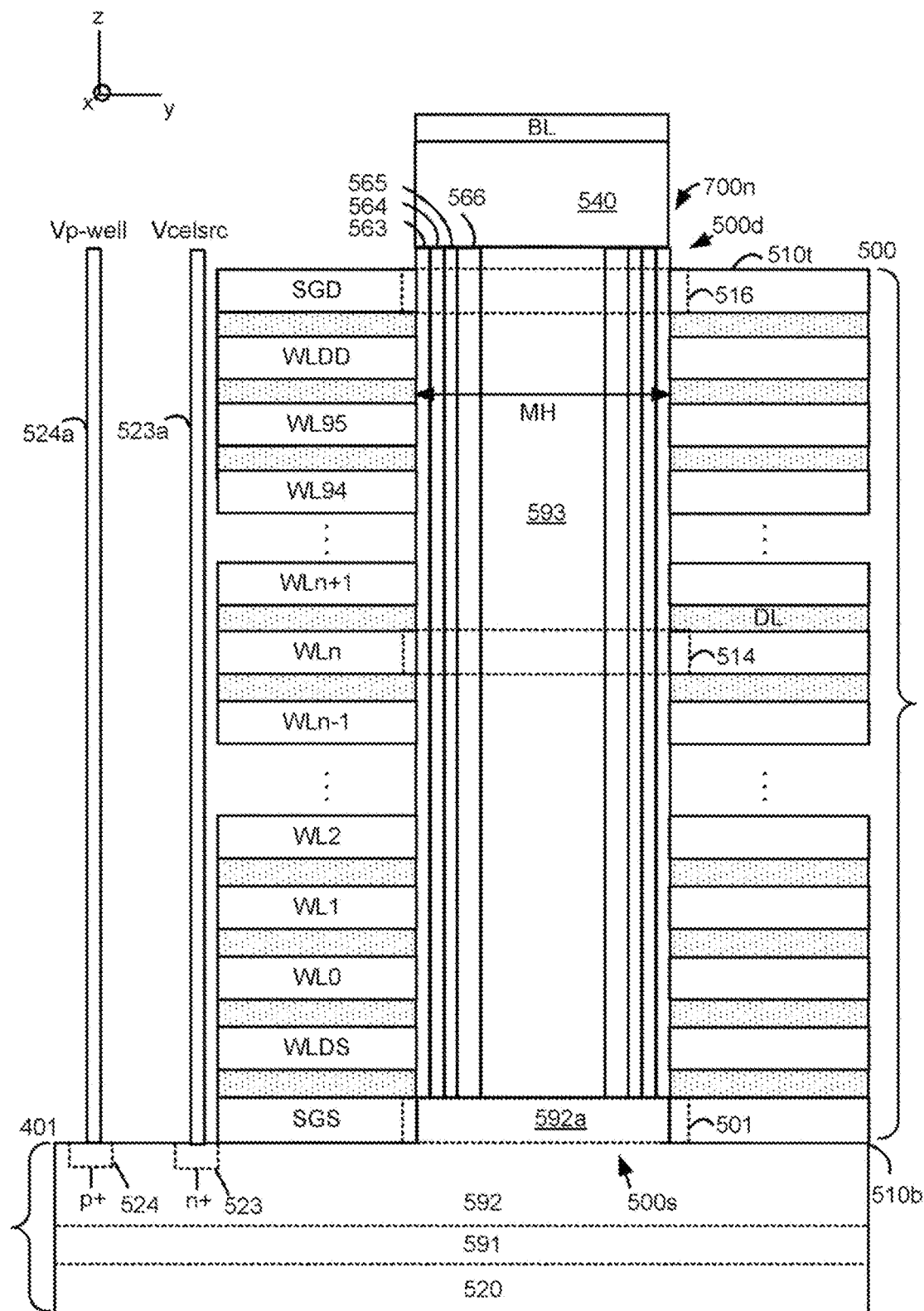
FIG. 5 depicts an example cross-sectional view of a portion of the block B0-0 of FIG. 4, including a NAND string according to aspects of the disclosure.

In this example, the memory cells are formed in vertical NAND strings in the blocks, consistent with FIG. 5. Each block comprises a stacked area of memory cells, where alternating levels of the stack represent word lines. In one possible approach, each block has opposing tiered sides from which vertical contacts extend upward to an upper metal layer to form connections to conductive paths. While two planes are depicted as an example, other examples can use four or more planes. One plane per die is also possible.

FIG. 5 depicts an example cross-sectional view of a portion of the block B0-0 of FIG. 4, including a NAND string 700$n$. The block comprises a stack 500 of alternating conductive layers (e.g., select gate layers and word line layers) and dielectric layers. The layers may be rectangular plates having a height in the z direction, a width in the y direction, and a length in the x direction. Example conductive layers include SGS, WLDS, WL0, WL1, WL2, . . . , WLn–1, WLn, WLn+1, . . . , WL94, WL95, WLDD and SGD. WLn denotes a selected word line for a read or program operation. The dielectric layers are shown by a dotted pattern and include an example dielectric layer DL. The conductive layers extend in a memory hole MH (see also FIG. 6).

The stack is depicted as comprising one tier but can optionally include one or more tiers of alternating conductive and dielectric layers. For example, see a stack comprising a bottom tier (BT) and a top tier (TT) in FIG. 7. A stack comprises a set of alternating conductive and dielectric layers in which a memory hole is formed in a fabrication process.

The conductive layers comprise SGS, WLDS, WL0-WL95, WLDD and SGD(0), in addition to 96 data word lines in this example, although the number of data word lines could be greater or less than 96.

The conductive layers connected to control gates of memory cells are referred to as word lines, and the conductive layers connected to control gates of source-side select gate transistors and drain-side select gate transistors are referred to as source-side and drain-side control lines, respectively. WLDS and WLDD are dummy word lines or conductive layers connected to dummy memory cells. A dummy memory cell may have the same construction as a data memory cell but is considered by the controller to be ineligible to store any type of data including user data. One or more dummy memory cells may be provided at the drain and/or source ends of a NAND string of memory cells to provide a gradual transition in the channel voltage gradient. WL0-WL95 are data word lines connected to data memory cells, which are eligible to store user data.

A top 510$t$ and bottom 510$b$ of the stack are depicted. WL95 is the topmost data word line and WL0 is the bottommost data word line.

The NAND strings are formed by etching memory holes in the stack, then depositing multiple thin layers of materials along the sidewalls of the memory holes. Memory cells are formed in a region in which the word lines intersect with the multiple thin layers, and select gate transistors are formed in regions in which the SGS and SGD control lines intersect with the multiple thin layers. For example, a drain-side select gate transistor 516 is formed where the SGD control line intersects with the multiple thin layers, a source-side select gate transistor 501 is formed where the SGS control line intersects with the multiple thin layers, and a selected memory cell 514 is formed where WLn intersects with the multiple thin layers.

The multiple thin annular layers can be deposited, e.g., using atomic layer deposition. For example, the layers can include a blocking oxide layer 563, a charge-trapping layer 564 or film such as silicon nitride (Si3N4) or other nitride, a tunneling layer 565 (e.g., a gate oxide) and a channel layer 566 (e.g., comprising polysilicon). A dielectric core 593 (e.g., comprising silicon dioxide) can also be provided. In this example, all of the layers are provided in the memory hole. In other approaches, some of the layers can be provided in the word line or control line layer. The multiple thin layers form a columnar active area of a NAND string. A word line or control line can comprise a metal such as Tungsten.

The stack is formed on the substrate 401. In one approach, the substrate includes a p-well region 592 connected to the source ends of the NAND strings. The p-well region may comprise an epitaxial region 592a which extends upward adjacent to the SGS layer. The p-well region can include an n+ contact 523 connected to a local interconnect 523a (a conductive path or source line) for receiving Vcelsrc, and a p+ contact 524 connected to a conductive path 524a for receiving Vp-well. The local interconnect and conductive path can comprise a conductive material such as metal surrounded by an insulating material to prevent conduction with the metal of the adjacent word lines. The p-well region 592 can be formed in an n-well 591, which in turn is formed in a p-type semiconductor region 520 of the substrate, in one possible implementation.

The NAND string 700n has a source end 500s at a bottom 510b of the stack 500, connected to the p-well. The NAND string 500n also has a drain end 500d at a top 510t of the stack, connected to a bit line BL0 via a bit line contact 540 comprising an n-type material.

The NAND string in this 3D configuration is considered to have a floating body channel because the length of the channel is not formed on a substrate.

When a memory cell is programmed, electrons are stored in a portion of the charge-trapping layer which is associated with the memory cell. These electrons are drawn into the charge-trapping layer from the channel, and through the tunneling layer. The Vth of a memory cell is increased in proportion to the amount of stored charge. During an erase operation, the channels of the NAND string are charged up, such as by applying a positive erase pulse to the substrate, causing the electrons to return to the channel from the charge trapping layer.

Figure 6:
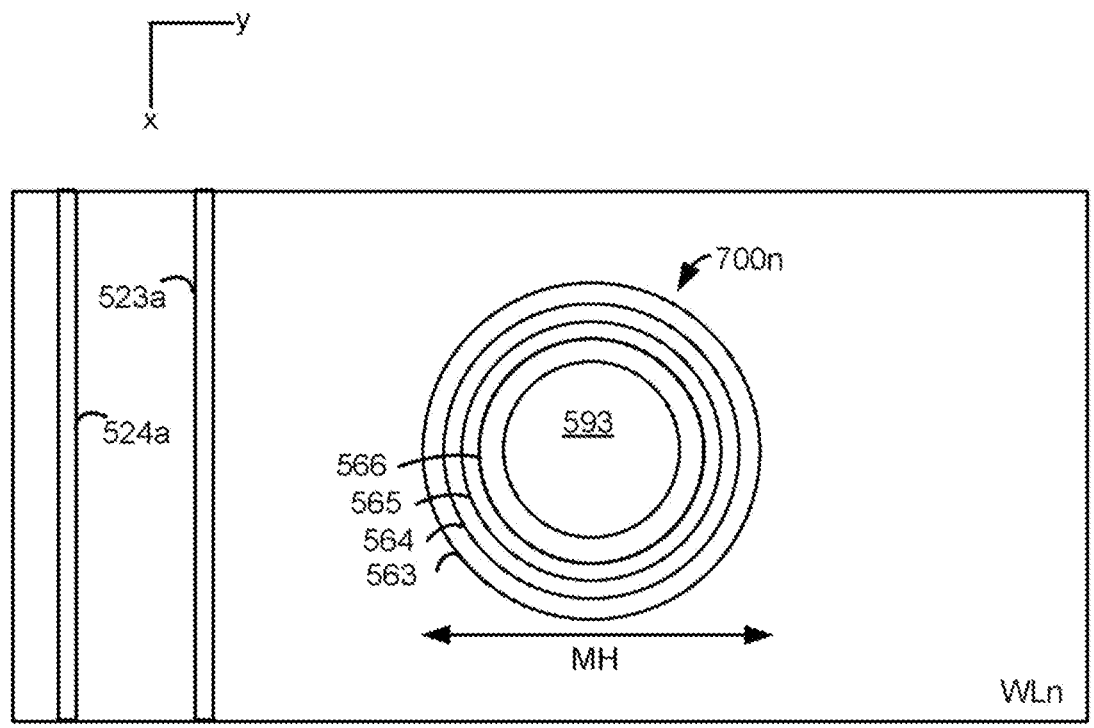
FIG. 6 depicts an example cross-sectional view of the block portion of FIG. 5 in the x-y plane at the level of WLn according to aspects of the disclosure.

FIG. 6 depicts an example cross-sectional view of the block portion of FIG. 5 in the x-y plane at the level of WLn. The layers of the NAND string 700n are depicted, including the blocking oxide layer 563, charge-trapping layer 564, tunneling layer 565 and the channel layer 566. The dielectric core 593 is also depicted.

Figure 7:
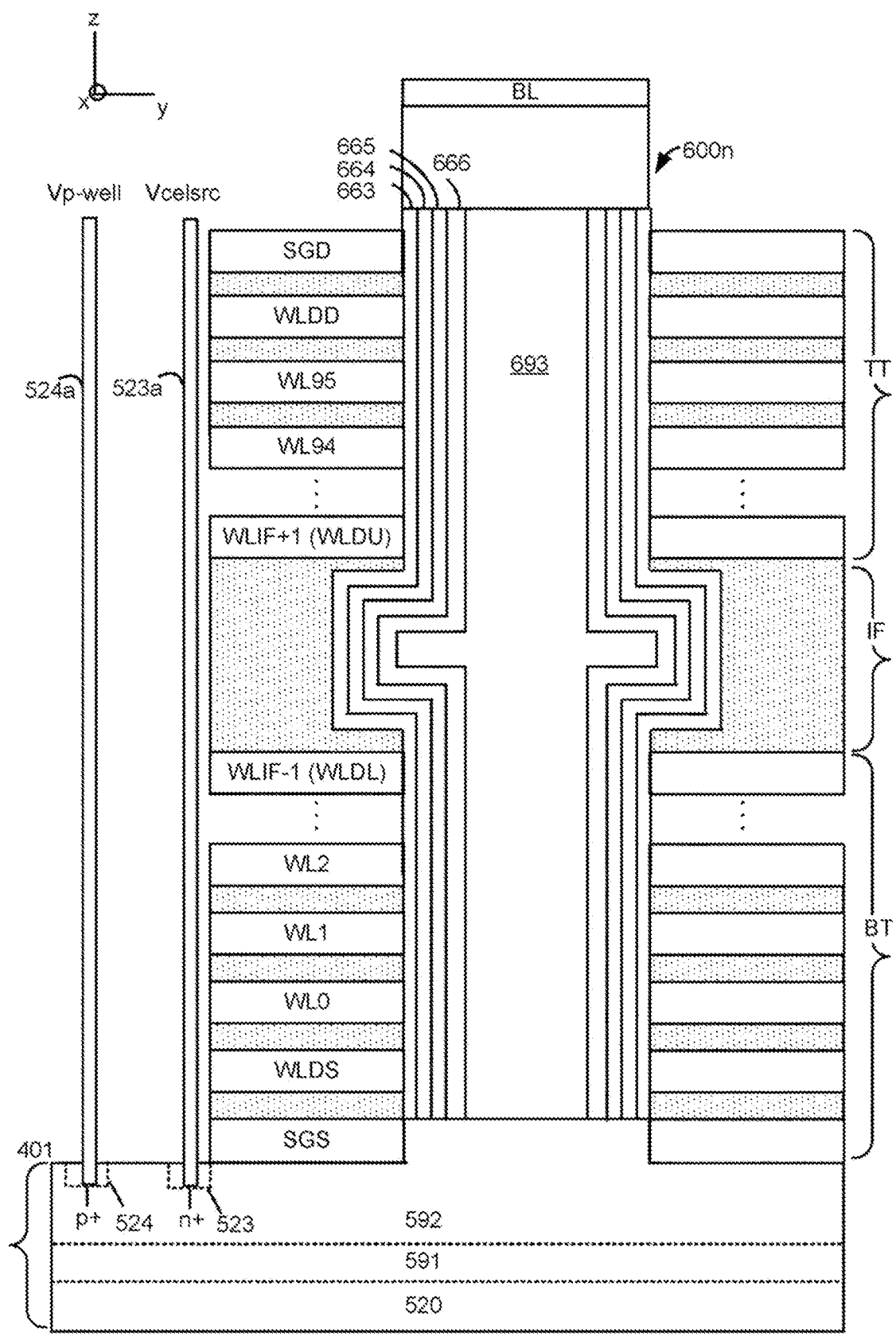
FIG. 7 depicts another example cross-sectional view of a portion of the block B0-0 of FIG. 4, including a NAND string, where the block comprises two tiers according to aspects of the disclosure.

FIG. 7 depicts another example cross-sectional view of a portion of the block B0-0 of FIG. 4, including a NAND string 600n, where the block comprises two tiers. Like-numbered elements correspond to those in FIG. 5. A multi-tier stack can be taller and have more layers than a single tier stack, which is limited by the ability to accurately etch a memory hole through multiple layers. In a multi-tier stack, a bottom tier of layers is formed and memory holes are etched. A top tier of layers is then formed on the bottom tier and memory holes are etched in the top tier which align with the memory holes in the bottom tier, to form continuous memory holes which extend through both tiers. Two or more tiers can be used. The top of the memory hole of the first tier tends to be widened at the top, in the IF, to form a base for aligning with the later formed memory hole in the top tier. A NAND string 600n is formed which includes a blocking oxide layer 663, a charge-trapping layer 664, a tunneling layer 665, a channel layer 666, and a dielectric core 693.

In this example, the block comprises a stack of alternating conductive and dielectric layers in two tiers, including a bottom tier BT and a top tier TT. The tiers are separated by an interface (IF) region which is formed of a dielectric material. The word lines include, e.g., WL0 to WLIF−1 (WLDL) in the BT, and WLIF+1 (WLDU) to WL95 in the TT, where WLIF−1 is the word line adjacent to and below the IF, and WLIF+1 is the word line adjacent to and above the IF. Optionally, the word lines adjacent to the IF are allocated as dummy word lines WLDL and WLDU.

Additionally, the height of the IF is greater than the height of the remaining dielectric layers between the word lines. As a result, there is a reduced conductivity in the interface so it is more difficult for the electrons to move through the interface.

FIG. 8 depicts an example view of the block B0-0 of FIG. 4, with respective NAND strings arranged in sub-blocks, along with associated bit lines and sense circuits. The set of word lines WL0-WL95 are connected to memory cells arranged in NAND strings. The NAND strings are arranged in sub-blocks of the block in a 3D configuration. The block is consistent with FIGS. 5 to 7. Each sub-block SB0-SB3 includes multiple NAND strings. Three example NAND strings are depicted, as a simplification. For example, SB0 comprises NAND strings 700n, 700n1 and 700n2, SB1 comprises NAND strings 710n, 710n1 and 710n2, SB2 comprises NAND strings 720n, 720n1 and 720n2, and SB3 comprises NAND strings 730n, 730n1 and 730n2. The NAND strings have data word lines, dummy word lines and select gate lines. Each sub-block comprises a set of NAND strings which extend in the x direction and which have a common SGD line or control gate layer. In particular, SGD(0)-SGD(3) are in SB0-SB3, respectively.

Programming of the block may occur based on a word line programming order. One option is to program the memory cells in different portions of a word line which are in the different sub-blocks, one sub-block at a time, before programming the memory cells of the next word line. For example, this can involve programming WL0 in SB0, SB1, SB2 and then SB3, then programming WL1 in SB0, SB1, SB2 and then SB3, and so forth. In one option, referred to as a regular programming order, the word line programming order may start at WL0, the source end word line and end at WL95, the drain end word line, for example. In another option, referred to as a reverse programming order, the programming starts from the highest word line, e.g., WL95, and ends at the lowest word line, e.g., WL0. This option can provide reduced neighbor word line interference.

Reading can occur for memory cells connected to a selected word line in a selected sub-block. Reading can occur one sub-block at a time.

In an erase operation, typically the entire block is erased, although a partial block erase is also possible.

Each NAND string comprises a plurality of memory cells between an SGS transistor and a SGD transistor, in this example. In other examples, more than one SGD and/or SGS transistor can be provided for each NAND string. The number of dummy memory cells can also vary. For example, the NAND string 700n includes an SGS transistor 701, a dummy memory cell 702, data memory cells 703-710, a dummy memory cell 711 and an SGD transistor 712. The NAND string 710n includes an SGS transistor 721, a dummy memory cell 722, data memory cells 723-730, a dummy memory cell 731 and an SGD transistor 732. The NAND string 720n includes an SGS transistor 741, a dummy memory cell 742, data memory cells 743-750, a dummy memory cell 751 and an SGD transistor 752. The NAND string 730n includes an SGS transistor 761, a dummy memory cell 762, data memory cells 763-770, a dummy memory cell 771 and an SGD transistor 772.

This example depicts one SGD transistor at the drain end of each NAND string, and one SGS transistor at the source end of each NAND string. The SGD transistors in SB0, SB1, SB2 and SB3 may be driven by separate control lines SGD(0), SGD(1), SGD(2) and SGD(3), respectively, in one approach. In another approach, multiple SGD and/or SGS transistors can be provided in a NAND string.

A set of bit lines, including example bit lines BL0-BL2, are connected to the NAND strings. Each bit line is connected to a respective set of NAND strings, including one NAND string in each sub-block. For example, BL0 is connected to NAND strings 700n, 710n, 720n and 730n in SB0-SB3, respectively, BL1 is connected to NAND strings 700n1, 710n1, 720n1 and 730n1 in SB0-SB3, respectively, and BL2 is connected to NAND strings 700n2, 710n2, 720n2 and 730n2 in SB0-SB3, respectively. Each bit line is also connected to a respective sense circuit, consistent with the sense circuits of FIG. 2. For example, BL0-BL2 are connected to sense circuits 60-62, respectively.

The row decoder 124 is at one side of the block in this example, in a peripheral area of the substrate, consistent with the control circuitry 110 depicted in FIG. 4. The row decoder routes voltage signals to the word line via conductive paths 810. In one approach, the conductive paths extend vertically in the z direction to the upper region 403, then horizontally in the y direction and then vertically down in the −z direction in vias which contact the word lines. The side of the block may have a stair step shape in which the vias can contact an edge of each word line. In this example, it is assumed that the stair step shape is closest to SB0. As a result, the RC delay of a word line voltage signal will be smallest for SB0 and largest for SB3. The distance between the row decoder and the sub-blocks is considered to increase progressively for SB0-SB3.

FIG. 9A depicts threshold voltage (Vth) distributions for an eight-state memory device. Eight data states, or three bits per cell, are depicted as an example. The techniques herein can apply to other modes include one or more bits per cell. The vertical axis depicts a number of memory cells on a logarithmic scale and the horizontal axis depicts a threshold voltage on a linear scale. The Vth distributions can represent memory cells connected to a word line or all memory cells in a block. After erasing the block, the Vth distribution 900 is obtained, representing the erased state. The erase operation is completed when the Vth of all, or nearly all, of the memory cells is below a verify voltage of VvEr.

The memory cells are then subject to a programming operation. Each of the memory cells will have an assigned data state. Some of the memory cells are assigned to the erased state and are not programmed. Most of the memory cells are programmed to higher states, such as A-F, in this example, as represented by Vth distributions 901-907, respectively. These memory cells are subject to verify tests using verify voltages of VvA-VvG.

In a read operation, the memory cells can be read by applying the read voltages VrA-VrG applied to the selected word line. The data which is programmed or read can be arranged in pages. In one approach, one page of data is read at a time. For example, with eight data states a lower page of data can be read using VrA and VrE, a middle page of data can be read using VrB, VrD and VrF, and an upper page of data can be read using VrC and VrG.

The arrow 910 depicts a decrease in the threshold voltage distributions which can occur when the memory cells and associated word lines transition to a first read condition after being programmed. A decrease in the Vth is typically seen for the lower half of the programmed data states, such as states A-C in this eight-state example. Similarly, the arrow 911 depicts an increase in the threshold voltage distributions which can occur when the memory cells and associated word lines transition to the first read condition. An increase in the Vth is typically seen for the upper half of the programmed data states, such as states E-G in this example.

When the word lines are in a coupled up state, i.e., in the second read condition, the word line voltage tends to prevent a downshift in the Vth of lower state memory cells, since the word line voltage can be greater than the Vth of lower state memory cells. Similarly, the word line voltage tends to prevent an upshift in the Vth of higher state memory cells. When the word lines are in the discharged or first read condition, this tends to allow a downshift in the Vth of the lower state memory cells and an upshift in the Vth of higher state memory cells. The memory cells gradually transition from the second read condition to the first read condition over time, e.g., seconds or minutes, as the word lines are discharged. The shift in the Vth of the memory cells can cause read errors. One approach to avoiding read errors is to adjust the read voltages when the word lines are in the first read condition.

FIG. 9B depicts a voltage signal used in a series of program loops in an example program operation which results in the Vth distribution of FIG. 9A. During a program operation, program loops are performed for a selected word line in a selected block. A program loop, or program-verify iteration, comprises a program portion in which a program voltage or pulse is applied to the selected word line followed by a verify portion in which one or more verify voltages are applied to the selected word line. During the application of the verify voltages, verify tests are performed for the associated memory cells.

The voltage signal 950 includes a series of program voltages, including an initial program voltage 951, which are applied to a word line selected for programming. In this example, the voltage signal includes program voltages which increase stepwise in amplitude in one or more program loops of a programming pass using a fixed or varying step size. This is referred to as incremental step pulse programming, where the program voltage starts at an initial level, Vpgm_int, and increases in a step in each successive program loop, for instance, until the program operation is completed. The operation is successfully completed when the threshold voltages of the selected memory cells reach the final verify voltages of the assigned data states.

A program operation can include a single programming pass or multiple programming passes, where each pass uses incremental step pulse programming, for instance.

The verify voltages in each program loop, including example verification signals 952, can encompass lower assigned data states and then midrange assigned data states and then higher assigned data states as the program operations proceeds. The example verify voltages depict three verify voltages as a simplification. The verify voltages are part of a sensing operation. Memory cells are sensed during the application of the verification signal to judge their programming progress. A verify voltage is used to judge the programming progress of a memory cell. For example, see FIG. 10A and verify voltages (plots 1007 and 1008) for the A and B state, VvA and VvB, respectively. The result of sensing of the Vth relative to its verify voltage can be used to inhibit further programming of a memory cell.

In FIG. 10A-10G, the vertical dimension denotes voltage and the horizontal dimension denotes time, with time points t0-t13. The period of time depicted corresponds to one program loop and includes a pre-charge phase 1090 (t0-t2), a program phase 1091 (t2-t4), a recovery phase 1092 (t4-t9) and a verify phase 1092 (t9-t13). The voltages depicted are examples.

FIG. 10A depicts voltages applied to a selected word line, WLn in a first program loop of a program operation, consistent with FIG. 9B.

A plot 1001 represents 1 V, a plot 1002 represents a program pass voltage, Vpass, a plot 1003 represents a program voltage of Vpgm, a plot 1004 represents a positive recovery voltage of Vcc=3 V, a plot 1005 represents a voltage pulse at Vread, a plot 1006 represents 0 V, and plots 1007 and 1008 represent example verify voltages VvA and VvB, respectively. During the application of each verify voltage, a sensing operation occurs for the selected memory cells which are assigned to the data state being verified. The selected memory cells are connected to a selected word line, and can be in a selected sub-block. A program pulse comprises the plots 1002 and 1003.

FIG. 10B depicts a voltage, VWL_unsel, applied to unselected word lines, consistent with FIG. 10A. A plot 1010 represents 1 V, a plot 1011 represents Vpass=10 V, and a plot 1012 represents a positive recovery or transition voltage, Vpass2Vread. This refers to a voltage which is applied in a transition from the program pass voltage to the read pass voltage. A region 1014 represents an increase in VWL_unsel from Vpass2Vread to Vread. A plot 1013 represents Vread.

FIG. 10C depicts a voltage, Vbl_pgm, applied to bit lines of programmed NAND strings, consistent with FIG. 10A. A plot 1020 represents 1 V, and a plot 1021 represents 0.5 V.

FIG. 10D depicts a voltage, Vbl_inh, applied to bit lines of inhibited NAND strings, consistent with FIG. 10A. These are inhibited NAND strings in a selected sub-block. A plot 1030 represents 2 V and a plot 1031 represents 0 V at t7-t9 in the recovery phase. A plot 1032 represents 2 V in the verify phase.

FIG. 10E depicts a voltage, Vsgd_sel, applied to SGD transistors of a selected sub-block, consistent with FIG. 10A. A plot 1040 represents 8 V, a plot 1041 represents 2.5 V, a plot 1042 represents 0 V and a plot 1043 represents 8 V.

FIG. 10F depicts voltages applied to SGD transistors of unselected sub-blocks and to SGS transistors, consistent with FIG. 10A. A plot 1050 represents 8 V and a plot 1051 represents 2.5 V for Vsgd_unsel and Vsgs. A plot 1052 represents 8 V for Vsgs and a plot 1053 represents 0 V for Vsgd_unsel.

FIG. 10G depicts a voltage applied to a source line, consistent with FIG. 10A. A plot 1060 represents 1 V, a plot 1061 represents 0 V and a plot 1062 represents 1 V. In the pre-charge phase, a positive Vbl_inh (plot 1030) is provided to the drain-side channels of the inhibited NAND strings to remove residue electrons and to provide a small amount of boosting such as 1-2 V. The SGD transistors of the selected and unselected sub-blocks are in a conductive state at this time, with a voltage of 8 V, for example. This allows the bit line voltage to be passed to the drain end channel. It is also possible for the SGS transistors of the selected and unselected sub-blocks to be in a conductive state at this time, with a voltage of 8 V, for example to allow Vsl to be passed to the source end of the channel. A plot 1031 represents Vbl_inh returning to 0 V at t7-t9 in part of the recovery phase, and a plot 1032 represents Vbl_inh at 2 V during the verify phase, for example.

In the program phase, VWLn and Vwl_unsel are ramped up, e.g., starting at t2, to provide a capacitive coupling up of the channels of the inhibited NAND strings. VWLn is then ramped up further at t3 to the peak level of Vpgm and held at Vpgm until t4. After the application of the program pulse, the word line voltages are ramped down in the recovery phase. Subsequently, in the verify phase, one or more verify tests are performed by applying one or more verify voltages on WLn and, for each verify voltage, sensing the conductive state of the memory cells in the programmed NAND strings of the selected sub-block. Before the verify tests, VWLn is ramped up with VWL_unsel to equalize the channel potential.

During the program pulse, Vsgd_sel is high enough to provide the selected SGD transistors in a conductive state for the programmed NAND strings, which receive Vbl_pgm=0 V, but low enough to provide the selected SGD transistors in a non-conductive state for the inhibited NAND strings, which receive Vbl_inh=2 V.

During the verify phase, the SGD and SGS transistors are in a strongly conductive state to allow sensing to occur for the selected memory cells.

Figure 11:
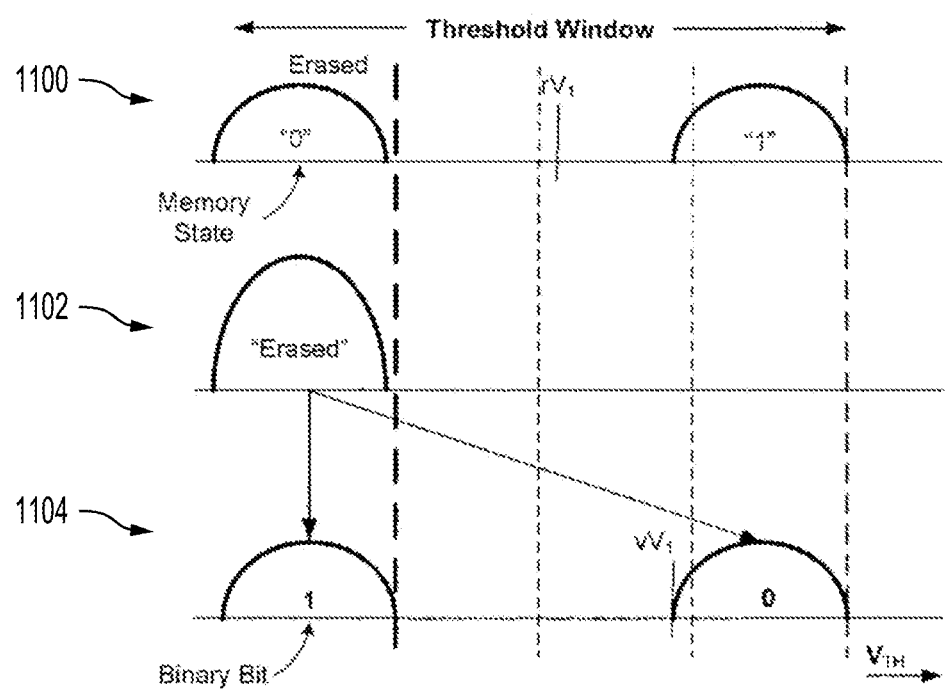
FIG. 11 illustrates a binary or single-level cell memory having a population of cells with each cell being in one of two possible states according to aspects of the disclosure.

FIG. 11 illustrates a binary memory having a population of cells with each cell being in one of two possible states. Each memory cell has its threshold window partitioned by a single demarcation level into two distinct zones. As shown in the plot labeled 1100, during read, a read demarcation level $rV_1$, between a lower zone and an upper zone, is used to determine to which zone the threshold level of the cell lies. The cell is in an "erased" state if its threshold is located in the lower zone and is in a "programmed" state if its threshold is located in the upper zone. Plot 1102 illustrates the memory initially has all its cells in the "erased" state. Plot 1104 illustrates some of cells being programmed to the "programmed" state. A 1-bit or binary code is used to code the memory states. For example, the bit value "1" represents the "erased" state and "0" represents the "programmed" state. Typically programming is performed by application of one or more programming voltage pulse. After each pulse, the cell is sensed to verify if the threshold has moved beyond a verify demarcation level $vV_1$. A memory with such memory cell partitioning is referred to as "binary" memory or Single-level Cell ("SLC") memory. It will be seen that a binary or SLC memory operates with a wide margin of error as the entire threshold window is only occupied by two zones.

Figure 12:
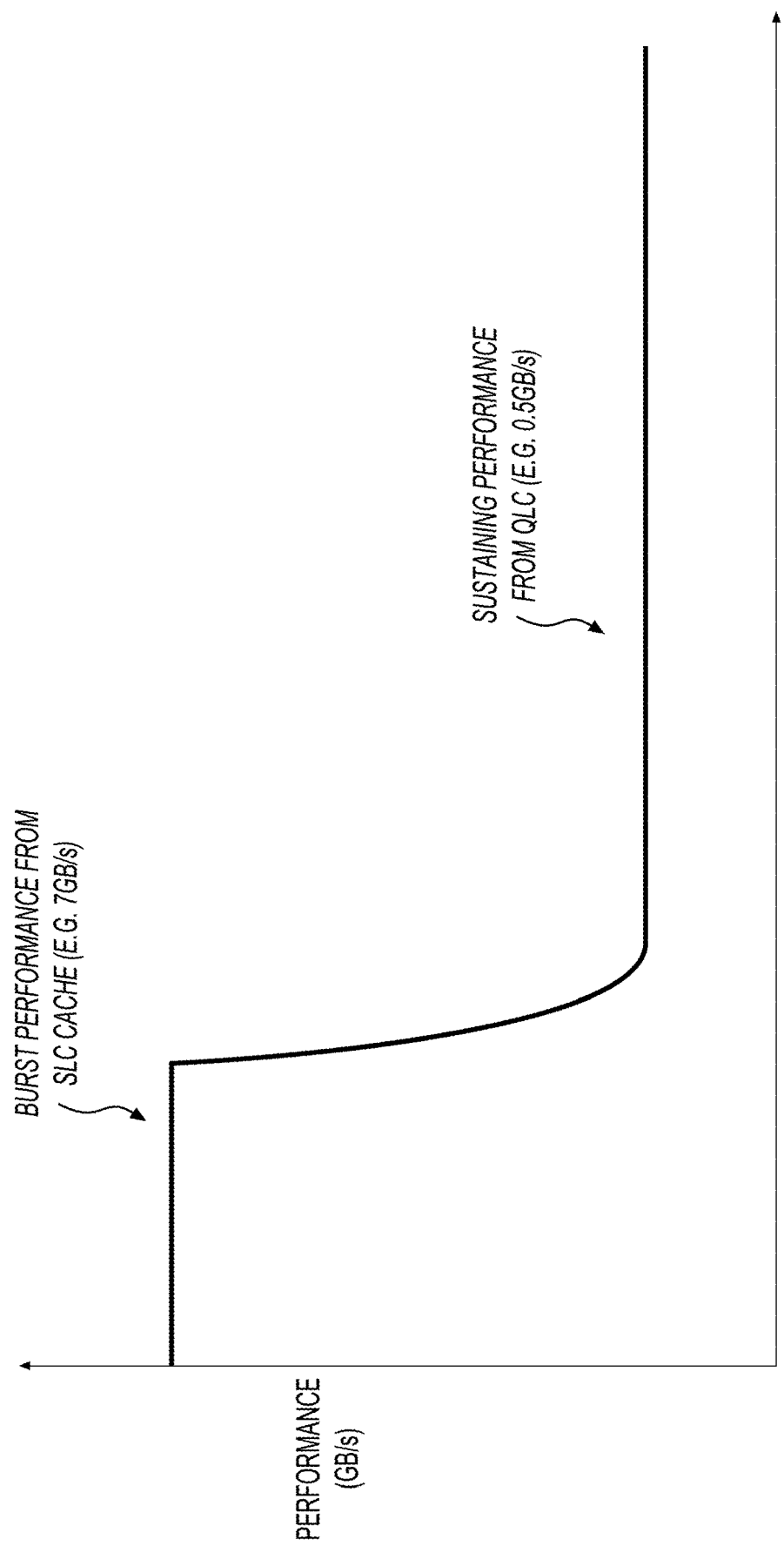
FIG. 12 is a plot of data transfer rate versus time for an example memory device operable initially with a burst performance from a single-level cell cache and later with a sustaining performance according to aspects of the disclosure.
Figure 13:
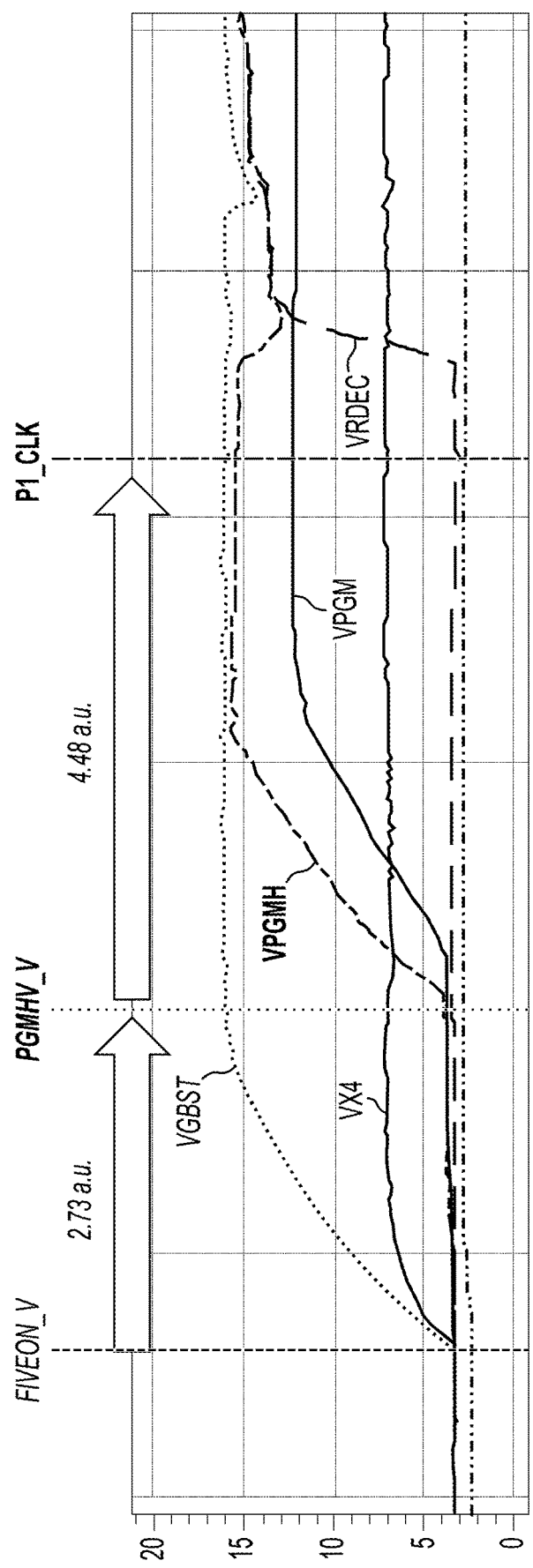
FIG. 13 shows a plot of circuit activity during a pump set according to aspects of the disclosure.
Figure 15A:
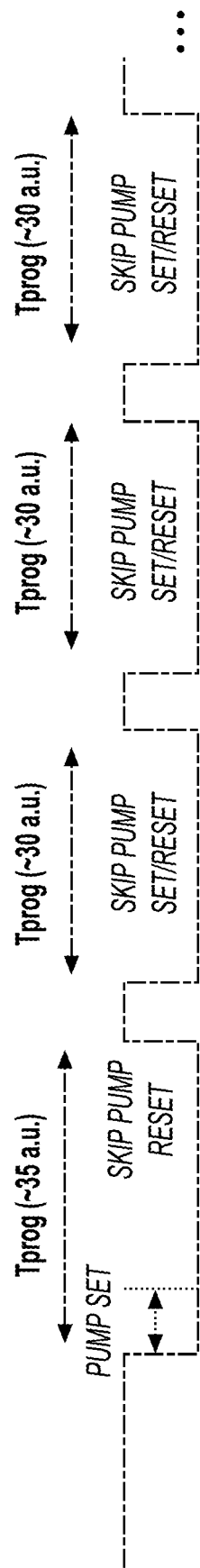
FIG. 15A shows a plot illustrating pump setting and pump resetting occurring during a sequential program operation when skipping or disabling the pump setting process and the pump resetting process of the charge pump in between each of the series of pulses of the program voltage according to aspects of the disclosure.
Figure 15B:
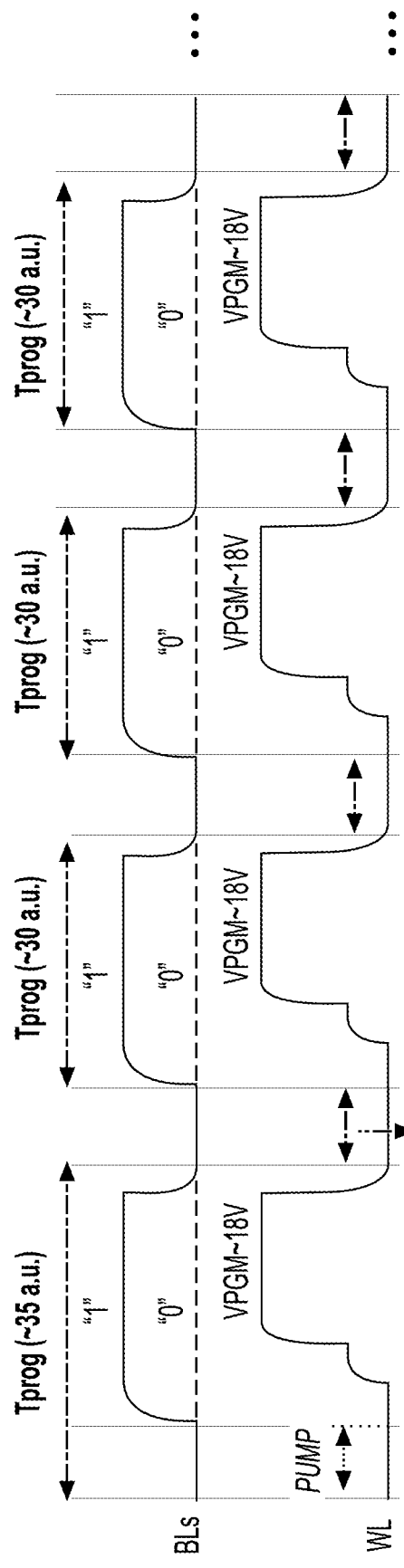
FIG. 15B shows voltages of selected bit lines and word lines during the SLC program operation of FIG. 15A and shows the pump setting and resetting being skipped according to aspects of the disclosure.

FIG. 12 is a plot of data transfer rate versus time for an example memory device operable initially with a burst performance from a single-level cell cache and later with a sustaining performance. Such, pseudo SLC (pSLC), hybrid SLC (hSLC), or dynamic SLC (dSLC) is a widely accepted method to boost system performance for triple-level cell (TLC)/quad-level cell (QLC) memory devices. By initially saving incoming user data in SLC format to the memory device, the user can experience fast SLC performance. Then, in the background (e.g., when the host system is idle), three SLC pages can be folded to TLC pages, or four SLC pages can be folded to QLC pages to maintain drive capacity. Thus, because the later sustaining performance is more dependent on background operation, faster SLC program time Tprog during the earlier burst performance is helpful for overall system performance. FIG. 13 shows a plot of circuit activity during a pump set. As shown, charge pumps (e.g., for the program voltage VPGM) ramp up during such a pump setting process. The array of memory cells cannot perform anything before the charge pumps are ready. As discussed above, setting and resetting of the charge pump can consume a large portion of programming time. Within the time periods for pump setting and pump resetting, the charge pumps (e.g., for the program voltage VPGM) are either ramping up (pump set/ready) or ramping down (pump reset). This occurs for each program cycle, even if programming happens back-to-back (burst write). FIG. 14A shows a plot illustrating pump setting and pump resetting occurring during a sequential program operation. FIG. 14B shows voltages of selected bit lines (BLs) and word lines (WL) during the SLC program operation of FIG. 14A. Because the pump setting and pump resetting take approximately 10 a.u. of the approximately 40 a.u. total SLC program time Tprog, there can be ~25% of the program time Tprog used by this non-array operation. Thus, performance of the memory device suffers due to this charge pump related activity. Accordingly, the control means of the memory apparatus may be configured to successively apply each of a series of pulses of the program voltage from the charge pump to each selected one of the plurality of word lines to program the memory cells during the program operation and skip (i.e., disable) the pump setting process and the pump resetting process of the charge pump in between each of the series of pulses of the program voltage. Specifically, for example, the memory apparatus can skip pump resetting or pump setting when the control means expects to write or is in the process of writing large amount of SLC data (e.g., sequential write). FIG. 15A shows a plot illustrating pump setting and pump resetting occurring during a sequential program operation when skipping or disabling the pump setting process and the pump resetting process of the charge pump in between each of the series of pulses of the program voltage. FIG. 15B shows voltages of selected bit lines (BLs) and word lines (WL) during the SLC program operation of FIG. 15A and shows the pump setting and resetting being skipped (except for the first pump setting and a pump resetting at the end of the sequential write or program operation). In comparison to FIGS. 14A and 14B, FIGS. 15A and 15B only include an idle time (e.g., 0 a.u.) between programming pulses. Since programming occurs back-to-back in the example, there is no need to waste time on pump resetting or setting. In other words, if it is known that a next SLC program command is coming, then the control means can skip pump resetting and setting. Skipping the pump setting and resetting can improve effective program time Tprog by >25% (40 a.u. to 30 a.u.).

Figure 16:
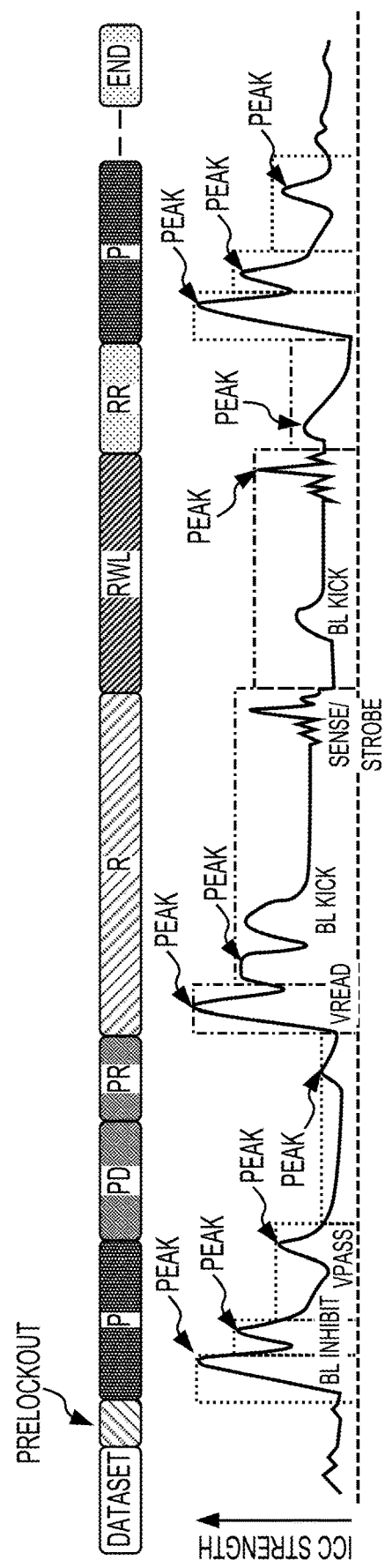
FIG. 16 shows current consumption strength for program operation including program stage and verify stage according to aspects of the disclosure.
Figure 18:
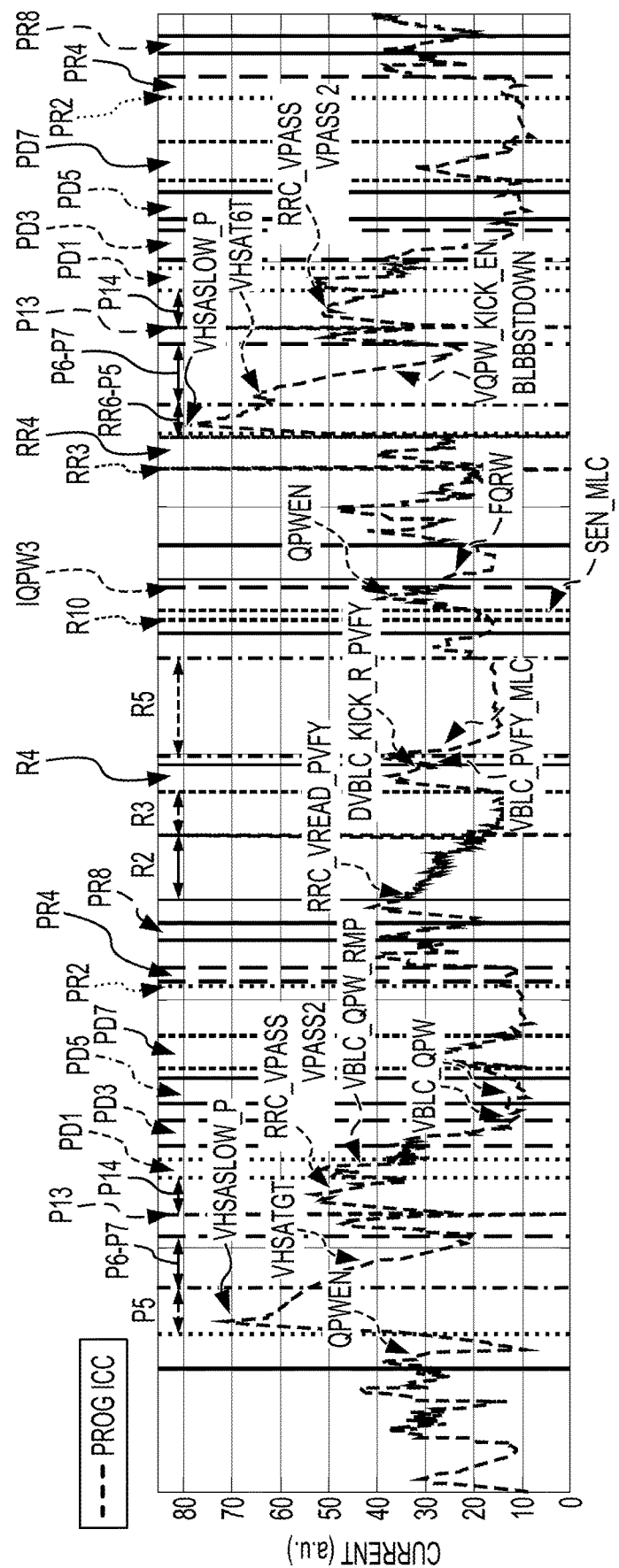
FIG. 18 shows current consumption strength for program operation including program stage and verify stage according to aspects of the disclosure.

In many memory apparatuses, peak and average current consumption (Icc or ICC) are important aspects. Power consumption is determined by average Icc and device performance on a system level is limited by ICC peak. ICC peak affect the system usage of NAND parallelism due to ICC peak exceeding the criteria. If memory apparatuses can reduce active Icc, it is possible to improve the performance and reduce power consumption. FIGS. 16 and 18 show Icc strength for program operation including program stage and verify stage. As shown, during program stage, the Icc peak occurs during a P5_CLK period owing to bit line setup. Various methods have been developed to reduce peak and average Icc for program operation. As shown, VHSASLOW_P and VHSATGT are applied to reduce Icc in the exemplary program operation. However, bit line setup induced high current still leads to the high Icc during the P5_CLK period. Therefore, it is important to reduce bit line setup induced high Icc issue.

Figure 17C:
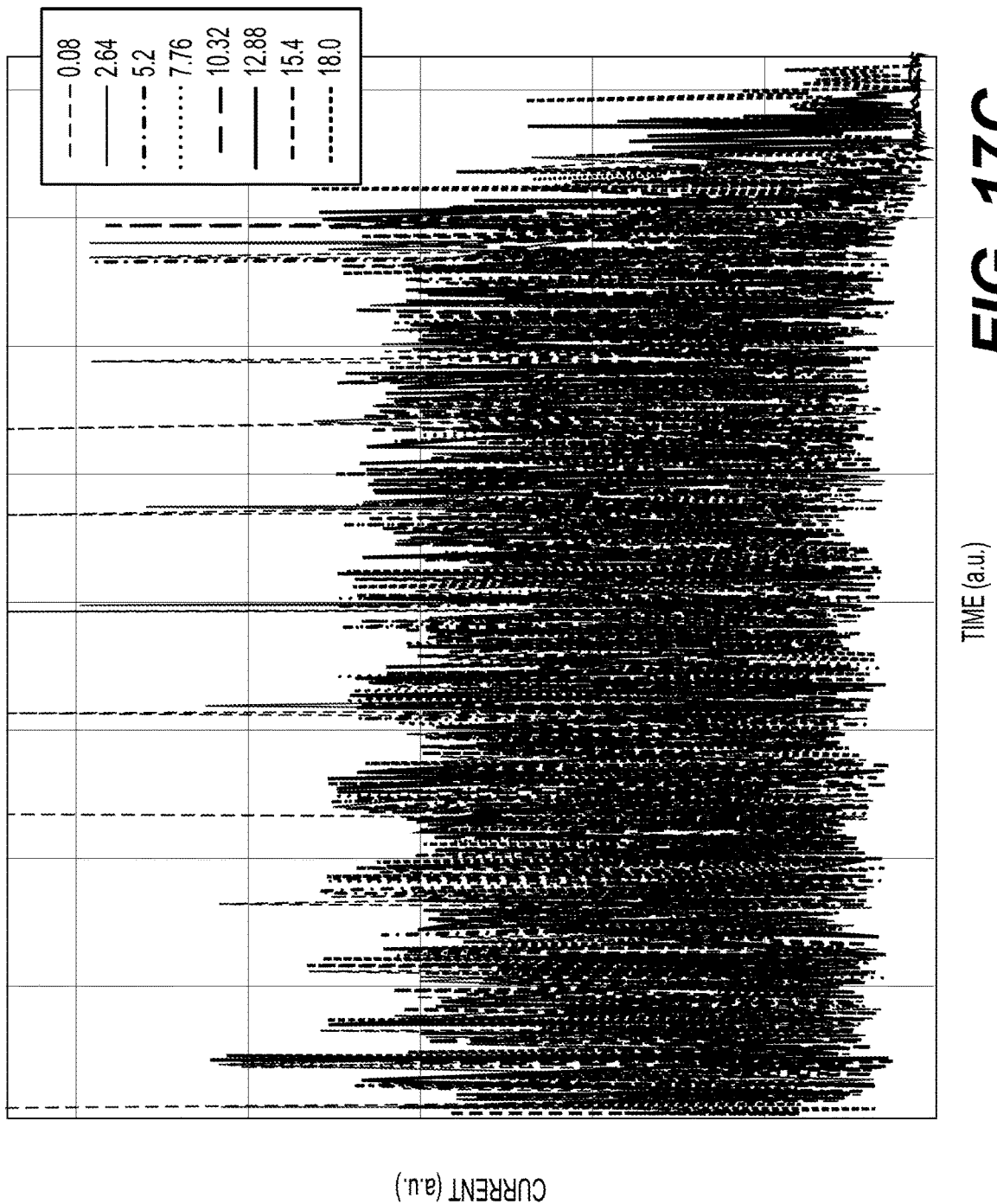

In more detail, FIGS. 17A-17C show plots of current consumption versus time for SLC (FIGS. 17A-17B) and TLC (FIG. 17C) for different timing of the P5_CLK period or P5. For single-level cells (SLC), program time Tprog monotonically decreasing with P5 setting indicates the setting dominates the P5 time length. For SLC, when P5 is less than 10.32 a.u., VHSATGT-related peak sticks out (arrow in FIG. 17B) indicating VHSATGT may need to be fine-tuned. For TLC, P5 can be reduced to 5.2 a.u. without the bit line pre-charge peak issue. So, while TLC P5 can be reduced to less than 5 a.u. without P5 (bit line pre charge) peak ICC issue, SLC P5 needs to be at least 10 a.u. to prevent P5 peak ICC issue.

Figure 19:
FIG. 19 shows a plot of voltages on selected and unselected bit lines during a programming pulse for a fast program mode with no verify stage according to aspects of the disclosure.

The fast program mode discussed above with reference to FIGS. 15A and 15B is utilized to gain higher program speed. As shown in FIG. 19, which shows a plot of voltages on selected and unselected bit lines during a programming pulse for the fast program mode, there is no verify stage for such a program operation. The unselected bit lines (BL) (unsel BL) ramp up from a bit line program voltage VSS (e.g., 0V) to a bit line inhibit voltage VDDSA for inhibiting and selected bit lines (sel BL) will remain at the bit line program voltage VSS for programming. To further improve the advantage of the fast program mode of FIGS. 15A-15B, for example, it is important to control active current consumption Icc.

Consequently, described herein is a memory apparatus (e.g., memory device 100 in FIG. 1A) including memory cells (e.g., data memory cells 703-710 of FIG. 8) each connected to one of a plurality of word lines (e.g., WL0-WL95 of FIG. 5). The memory cells are disposed in memory holes (e.g., MH of FIG. 5) and configured to retain a threshold voltage corresponding to one of a plurality of data states (e.g., "erased" state and "programmed" state of FIG. 11, states A-G of FIG. 9A). The memory apparatus additionally includes a control means (e.g., control circuitry 110, controller 122, row decoder 124, source control circuits 127, read/write circuits 128, sense blocks 150, and column decoder 132 in FIG. 1A) coupled to the plurality of word lines and the memory holes. The control means is configured to successively apply each of a series of pulses of a program voltage to selected ones of the plurality of word lines while simultaneously applying one of a bit line program voltage VSS and a bit line inhibit voltage VDDSA or VHSA to ones of the plurality of bit lines coupled to the memory holes containing groups of the memory cells connected to the selected ones of the plurality of word lines to program the groups of the memory cells with data during a program operation. The bit line program voltage VSS and the bit line inhibit voltage VDDSA or VHSA are selected based on the data being programmed to the memory cells (e.g., the bit line program voltage VSS can be used if the data being programed is a "1" and the bit line inhibit voltage VDDSA or VHSA can be used if the data being programmed is a "0" for single-level memory cells or (SLC)). The control means is also configured to maintain a voltage applied to ones of the plurality of bit lines as the bit line inhibit voltage VDDSA or VHSA in response to the ones of the plurality of bit lines remaining unselected when programming a next one of the groups of the memory cells. By avoiding the dis-charging and re-charging of inhibited or unselected bit lines for adjacent program pulses, the active current consumption Icc is reduced.

Referring back to FIG. 8, for example, the strings are each coupled to one of a plurality of bit lines (e.g., bit lines BL0-BL2) and the plurality of bit lines are coupled to the control means. further including a charge pump (e.g., multi-stage charge pump 348 of FIG. 3B) coupled to the control means and configured to ramp up to the program voltage in a pump setting process and supply the program voltage to the plurality of word lines during the program operation and ramp down from the program voltage in a pump resetting process. So, according to an aspect and referring back to FIGS. 15A and 15B, the control means is further configured to set the charge pump in the pump setting process. The control means is also configured to program the groups of the memory cells with the data during the program operation. The control means is additionally configured to skip the pump setting process and the pump resetting process of the charge pump in between each of the series of pulses of the program voltage. The control means then resets the charge pump in the pump resetting process following programming the memory cells connected to a final one of the plurality of word lines connected to the memory cells being programmed in the program operation.

Referring back to FIG. 5, for example, the plurality of word lines (e.g., WL0-WL95 of FIG. 5) and a plurality of dielectric layers (e.g., DL of FIG. 5) extend horizontally and overlay one another in an alternating fashion in a stack. The memory holes (e.g., MH of FIG. 5) extend vertically through the stack. The memory cells are connected in series between a drain-side select gate transistor (e.g., at SGD layer of FIG. 5) on a drain-side of each of the memory holes and a source-side select gate transistor (e.g., at SGS layer of FIG. 5) on a source-side of each of the memory holes. The drain-side select gate transistor of each of the memory holes is connected to one of the plurality of bit lines (e.g., BL of FIG. 5) and the source-side select gate transistor of each of the memory holes is connected to a source line (e.g., local interconnect 523a of FIG. 5). So, according to an aspect, the groups of the memory cells include collections of the memory cells associated with each of the plurality of word lines.

As discussed, the memory apparatus can further include at least one data transfer latch (e.g., latches 194-197 of FIG. 2) configured to store the data being programmed to each of the groups of the memory cells during the program operation. For example, for the programming operation described above with reference to FIGS. 15A and 15B, the data to be programmed next is received and stored in the at least one data transfer latch before a current programming loop or step is finished. Therefore, according to an aspect, the control means may be further configured to maintain the voltage applied to ones of the plurality of bit lines as the bit line inhibit voltage VDDSA or VHSA in response to the ones of the plurality of bit lines remaining unselected when programming the next one of the groups of the memory cells based on a comparison of the data of each of the groups of the memory cells to the data of the next one of the groups of the memory cells.

Figures 20A, 20B:
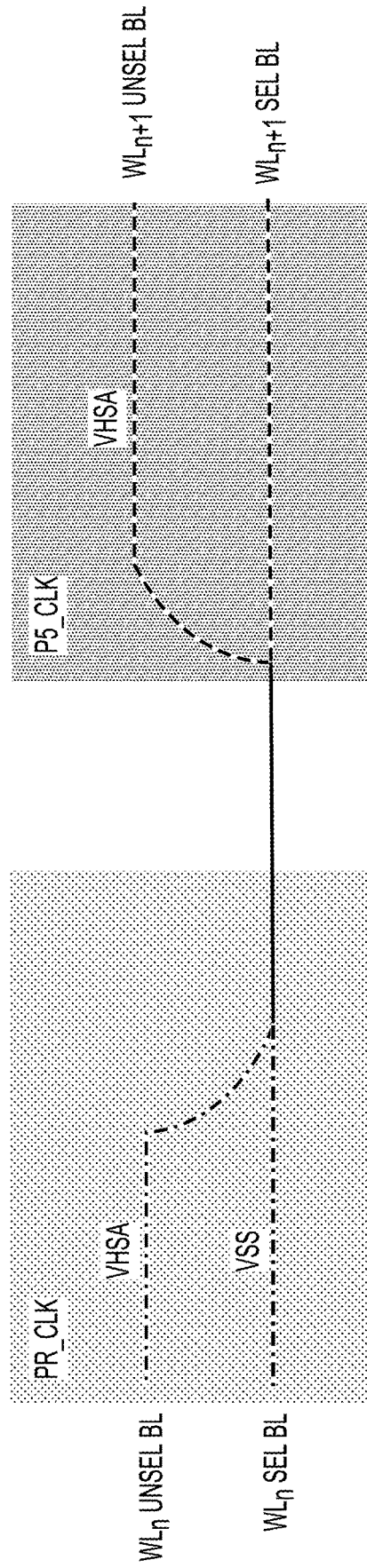
FIG. 20A shows a table showing values programmed to a selected word line of the plurality of word lines and a next word line of the plurality of word lines along with the voltage applied to unselected ones of the plurality of bit lines for four possible cases according to aspects of the disclosure.
FIG. 20B shows a plot of a voltage of selected and unselected ones of the bit lines for each of the four cases of FIG. 20A according to aspects of the disclosure.
Figure 20C:
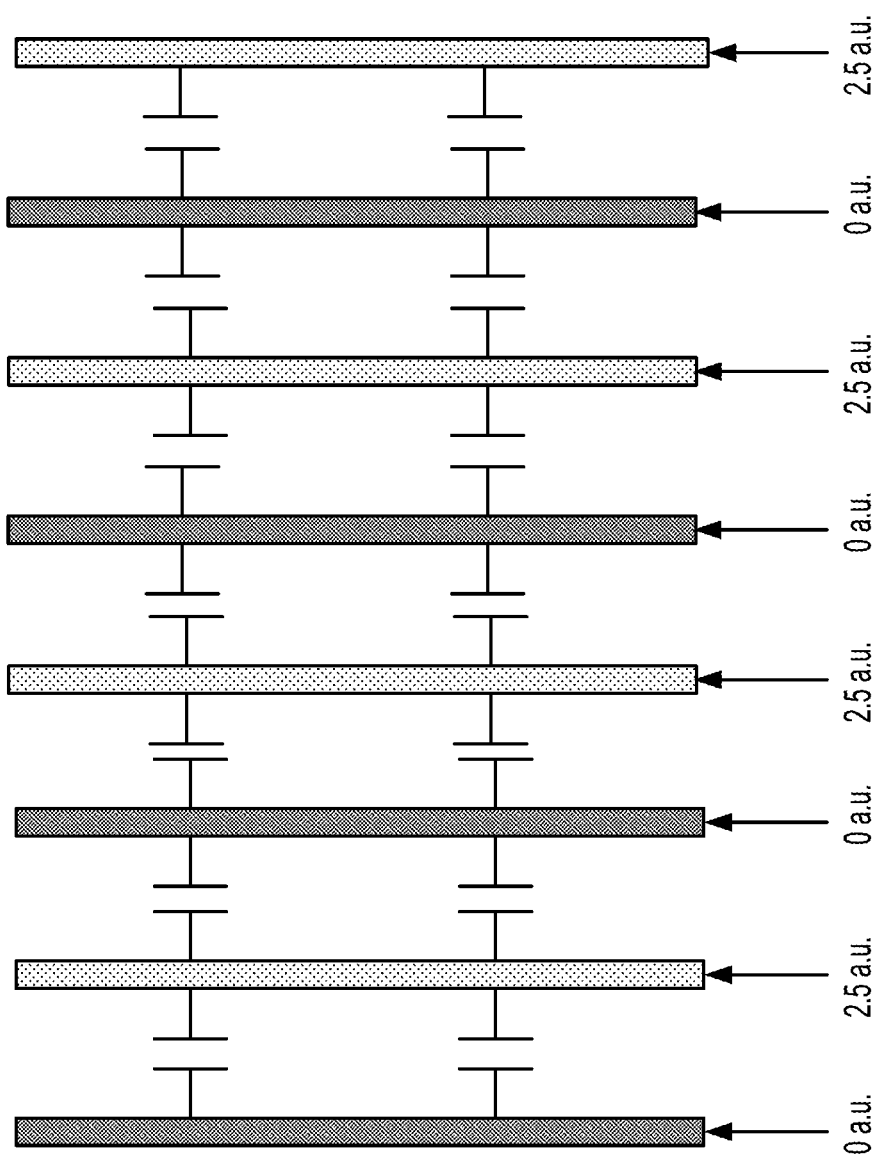
FIG. 20C shows which bit lines of a group of bit lines are being charged to the bit line inhibit voltage for a random pattern of data according to aspects of the disclosure.

FIG. 20A shows a table showing values programmed to a selected word line of the plurality of word lines (WLn) and a next word line of the plurality of word lines (WLn+1) (e.g., adjacent to one another in the stack) along with the voltage applied to unselected ones of the plurality of bit lines for four possible cases. FIG. 20B shows a plot of a voltage of selected and unselected ones of the bit lines for each of the four cases of FIG. 20A. FIG. 20C shows which bit lines of a group of bit lines are being charged to the bit line inhibit voltage VDDSA or VHSA for a random pattern of data. As shown, such a scheme ramps the unselected ones of the plurality of bit lines down from the bit line inhibit voltage VDDSA or VHSA to the bit line program voltage VSS no matter what data is next. In this example, during a PR_CLK period, approximately one half of the plurality of bit lines are discharged from the bit line inhibit voltage VDDSA or VHSA to the bit line program voltage VSS. Then, during a P5_CLK period, approximately one half of the plurality of bit lines are pre-charged from the bit line program voltage VSS to the bit line inhibit voltage VDDSA or VHSA.

Figures 21A, 21B:
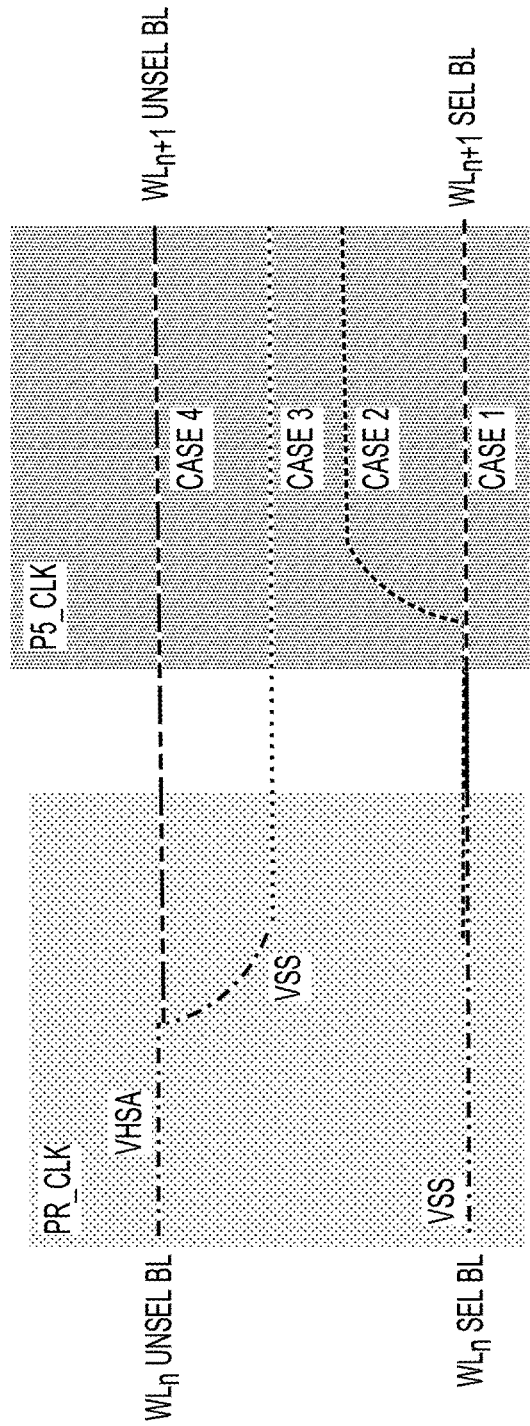
FIG. 21A shows another table showing values programmed to a selected word line of the plurality of word lines and the next word line of the plurality of word lines along with the voltage applied to unselected ones of the plurality of bit lines for the four possible cases according to aspects of the disclosure.
FIG. 21B shows a plot of the voltage of selected and unselected ones of the bit lines for each of the four cases of FIG. 21A according to aspects of the disclosure.
Figure 21C:
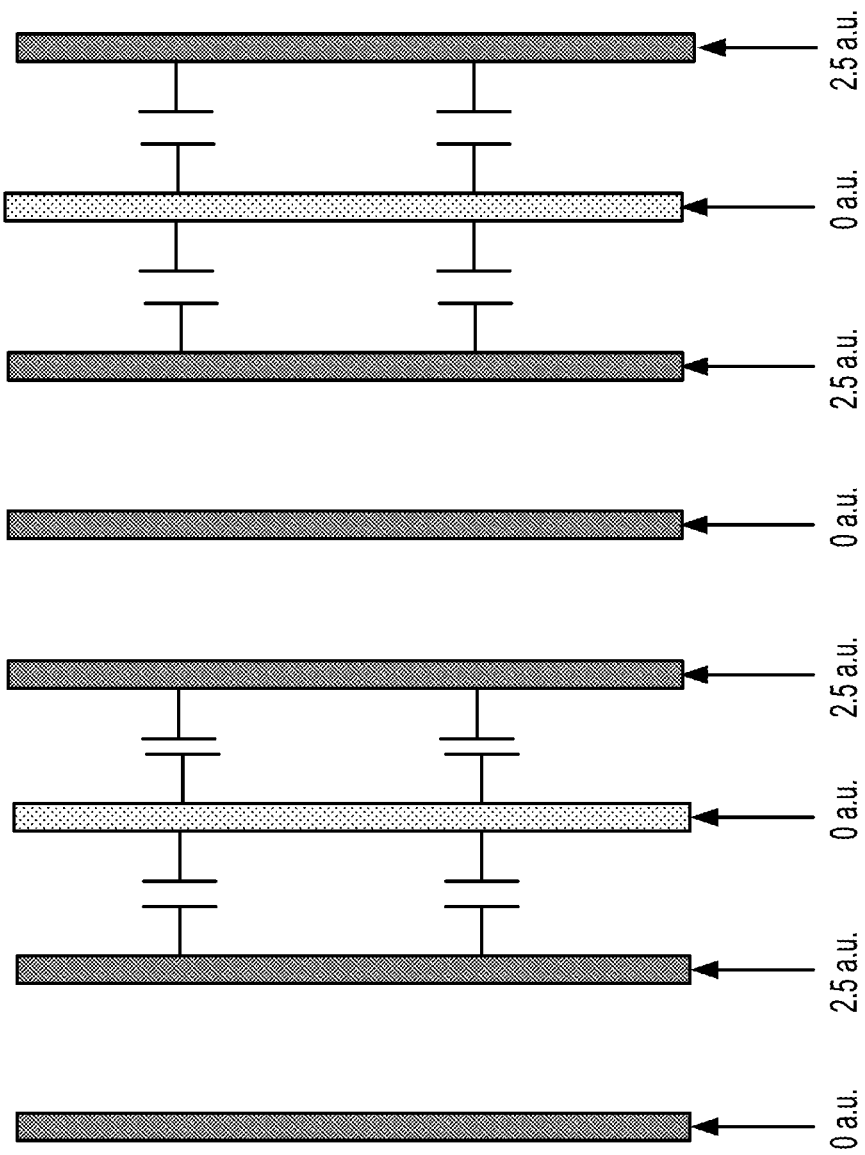
FIG. 21C shows which bit lines of the group of bit lines are being charged to the bit line inhibit voltage for the random pattern of data according to aspects of the disclosure.

In contrast to the scheme of FIGS. 20A-20C, FIGS. 21A-21C show the active Icc save mode scheme discussed herein, according to aspects of the disclosure. Specifically, FIG. 21A shows another table showing values programmed to a selected word line of the plurality of word lines (WLn) and the next word line of the plurality of word lines (WLn+1) (e.g., adjacent to one another in the stack) along with the voltage applied to unselected ones of the plurality of bit lines for the four possible cases. FIG. 21B shows a plot of the voltage of selected and unselected ones of the bit lines for each of the four cases of FIG. 21A. FIG. 21C shows which bit lines of the group of bit lines are being charged to the bit line inhibit voltage VDDSA or VHSA for the random pattern of data. As shown, the current data pattern (e.g., what has been programmed to WLn) can be compared with the next data pattern (e.g., what is to be programmed to the next word line, WLn+1). The voltage applied to each of the bit lines VBL can be kept at the bit line inhibit voltage VDDSA or VHSA if the next data pattern also needs the bit line to be inhibited. In that case, during the PR_CLK period, approximately one quarter of the plurality of bit lines are discharged or ramped down from the bit line inhibit voltage VDDSA or VHSA to the bit line program voltage VSS. Then, during the P5_CLK period, approximately one quarter of the plurality of bit lines are pre-charged from the bit line program voltage VSS to the bit line inhibit voltage VDDSA or VHSA. Since only one quarter of the bit lines need to be pre-charged, the bit line pre-charge current can be reduced, resulting in a reduction of the current consumption ICC.

According to additional aspects, the control means is further configured to determine whether the data for a next one of the collections of the memory cells associated with one of the plurality of word lines has been received. The control means then is configured to logically exclusive or the data of one of the collections of the memory cells associated with the selected one of the plurality of word lines with the data for the next one of the collections of the memory cells associated with the one of the plurality of word lines data of the next one of the groups of the memory cells and determine a result. Next, the control means is configured to determine whether the data of the one of the collections of the memory cells associated with the selected one of the plurality of word lines is equal to one in response to the result being one. The control means ramps up the voltage applied to ones of the plurality of bit lines to the bit line inhibit voltage VDDSA or VHSA in response to the data of the one of the collections of the memory cells associated with the selected one of the plurality of word lines being equal to one. The control means is also configured to ramp down the voltage applied to ones of the plurality of bit lines to bit line program voltage VSS in response to the data of the one of the collections of the memory cells associated with the selected one of the plurality of word lines not being equal to one.

In addition, the control means is configured to determine whether the data of the one of the collections of the memory cells associated with the selected one of the plurality of word lines is equal to one in response to the result being zero. The control means maintains the voltage applied to ones of the plurality of bit lines at the bit line program voltage VSS in response to the data of the one of the collections of the memory cells associated with the selected one of the plurality of word lines being equal to one. The control means also maintains the voltage applied to ones of the plurality of bit lines at the bit line inhibit voltage VDDSA or VHSA in response to the data of the one of the collections of the memory cells associated with the selected one of the plurality of word lines not being equal to one.

Figure 22:
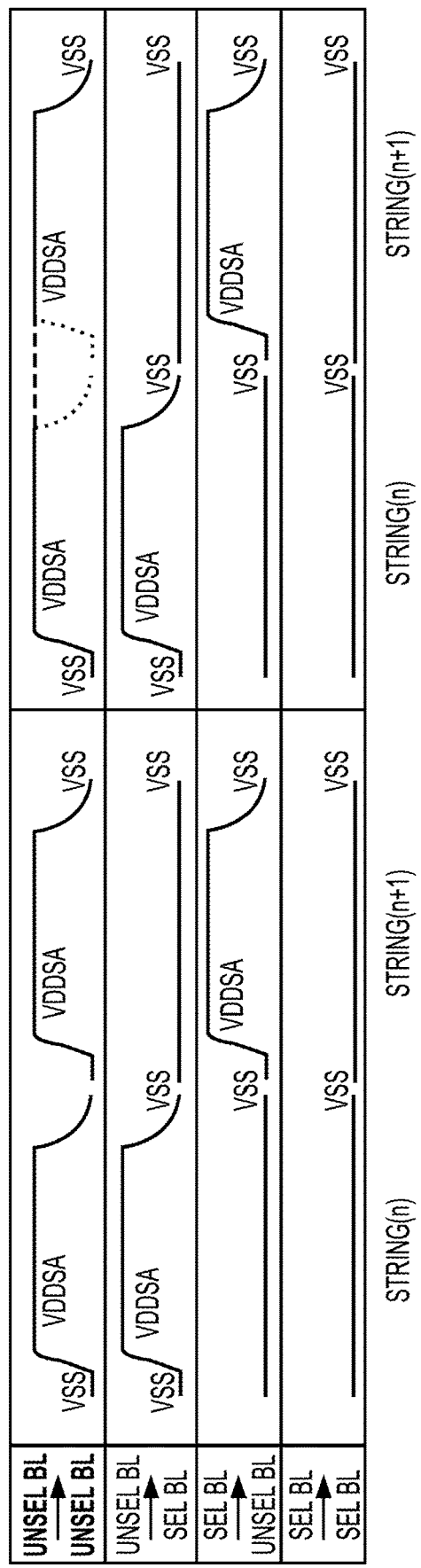
FIG. 22 shows four scenarios of bit line ramping for adjacent strings according to aspects of the disclosure.

Referring back to FIG. 8, for example, the memory holes or NAND strings (e.g., NAND string 700*n*) are in rows comprising a plurality of strings. Since there is no verify between adjacent fast programming steps for different strings, the P5_CLK period for string(n+1) is following the PR_CLK period of string(n). As for random pattern, there are around 50% of the plurality of bit lines will be programmed and around 50% of the plurality of bit lines will be inhibited for both string(n) and string(n+1), respectively. Considering the adjacent strings' fast program together, there are total four scenarios for their bit line conditions including unsel_BL to unsel_BL, unsel_BL to sel_BL, sel_BL to unsel_BL, sel_BL to sel_BL. FIG. 22 shows these four scenarios of bit line ramping. Each scenarios contain around 25% bit lines. (unsel_BL is the BL to be inhibited and sel_BL is the BL to be programed)

One scheme of fast programming for string(n) and string (n+1) is shown on the left hand side of FIG. 22. Both string(n) and string(n+1) are require to setup 50% of the plurality of bit lines from the bit line program voltage VSS (e.g., 0V) to the bit line inhibit voltage VDDSA or VHSA for inhibiting. As discussed, the 50% bit line setup induces high peak and average Icc.

Thus, the active Icc save mode scheme discussed herein for fast programming is shown on the right hand side of FIG. 22. Here, string(n) and string(n+1) are exemplary adjacent strings for fast programming. In the active Icc save mode scheme discussed herein for fast programming, string(n) needs to setup 50% bit lines for inhibiting as default. However, string(n+1) only needs to setup 25% of the bit lines from the bit line program voltage VSS (e.g., 0V) to the bit line inhibit voltage VDDSA or VHSA for inhibiting and the other 25% unsel_BL can remain at the bit line inhibit voltage VDDSA or VHSA from string(n) without discharging and re-charging (right hand side of FIG. 22). As a result, the average and peak Icc is expected to reduce 50%. According to an aspect, the groups of the memory cells include sets of the memory cells associated with each of the plurality of strings.

In the active Icc save mode scheme discussed herein for fast programming, the discharge for unsel BL for string(n) can be determined by the data to be programed on following string(n+1). If the data for string(n+1) is stored in the at least one data transfer latch (e.g., latches 194-197 of FIG. 2). During the PR_CLK period for string(n), the discharge of unsel_BL can be determined by the data in the at least one data transfer latch for string(n+1). Thus, it can avoid the discharging and re-charging for the bit line which will be inhibited for adjacent two program pulses.

If fast programming is utilized with all string verify, fast program on WLn string0 will work as default and the active Icc save mode scheme discussed herein for fast programming can be used on the following WLn string1-4. As discussed, WLn string1-4 can save 50% average and peak Icc (induced by bit line setup) through reducing half unsel_BL setup.

If fast programming is utilized without all string verify, the active Icc save mode scheme discussed herein for fast programming can be used on any adjacent program pulse. In addition to adjacent program pulse on string(n) and string (n+1), and neighboring word lines, as discussed above, the active Icc save mode scheme discussed herein for fast programming also can be used on adjacent blocks in the same plane, for example.

FIG. 23 shows an unselected bit line voltage parameter Icc_save stored in the memory apparatus. So, according to an aspect, the control means is further configured to access the unselected bit line voltage parameter and maintain the bit line inhibit voltage VDDSA or VHSA applied to ones of the plurality of bit lines in response to the ones of the plurality of bit lines remaining unselected when programming the next one of the groups of the memory cells based on the unselected bit line voltage parameter. To control the active Icc save mode scheme discussed herein, the unselected bit line voltage parameter Icc_save can enable or disable this function.

Figure 25:
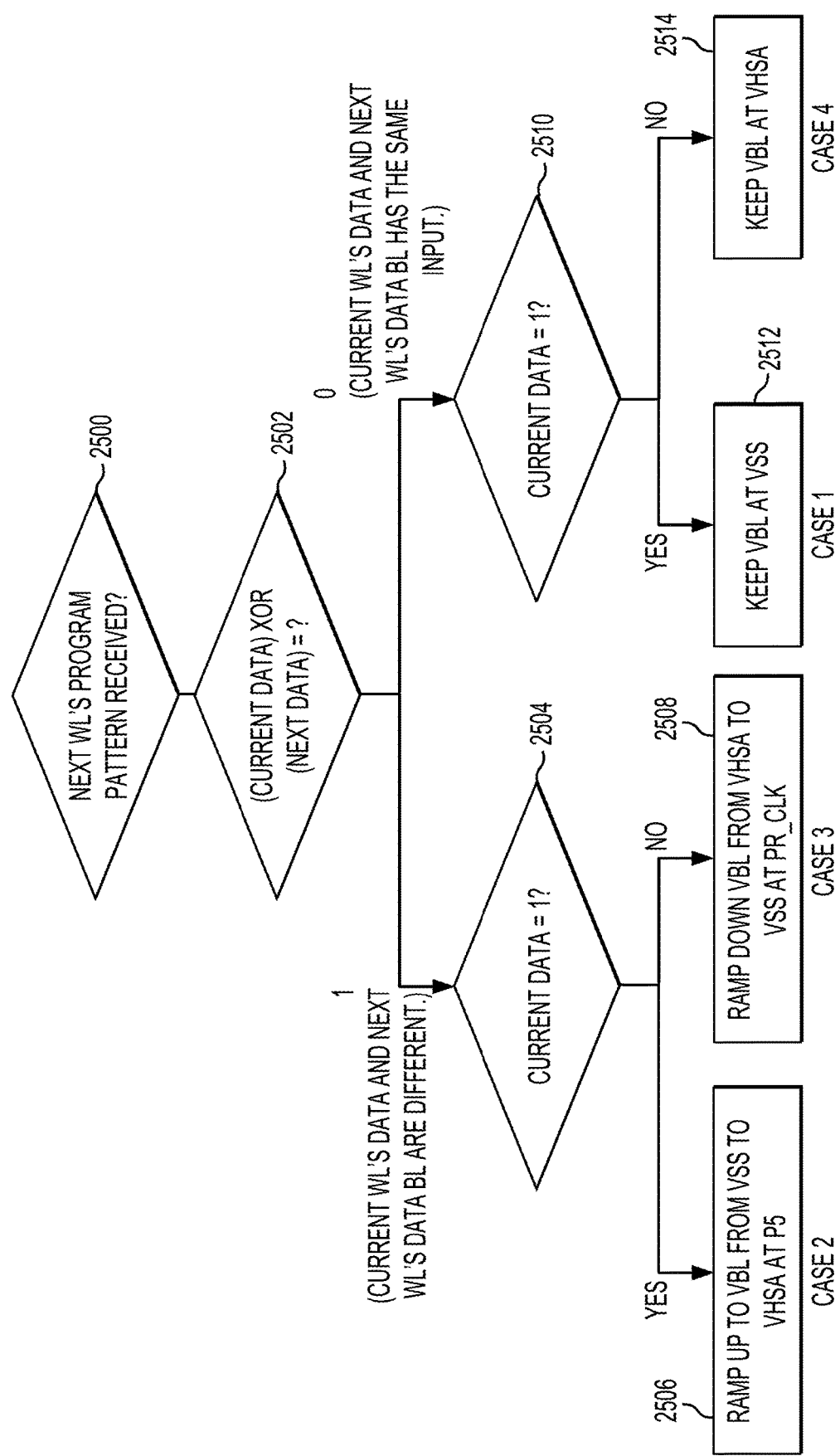

Now referring to FIGS. 24 and 25, a method of operating a memory apparatus is also provided. As discussed above, the memory apparatus (e.g., memory device 100 in FIG. 1A) includes memory cells (e.g., data memory cells 703-710 of FIG. 8) each connected to one of a plurality of word lines (e.g., WL0-WL95 of FIG. 5). The memory cells are disposed in memory holes (e.g., MH of FIG. 5) and configured to retain a threshold voltage corresponding to one of a plurality of data states (e.g., "erased" state and "programmed" state of FIG. 11, states A-G of FIG. 9A). So, the method includes the step of 2400 successively applying each of a series of pulses of a program voltage to selected ones of the plurality of word lines while simultaneously applying one of a bit line program voltage VSS and a bit line inhibit voltage VDDSA or VHSA to ones of the plurality of bit lines coupled to the memory holes containing groups of the memory cells connected to the selected ones of the plurality of word lines to program the groups of the memory cells with data during a program operation, the one of the bit line program voltage VSS and the bit line inhibit voltage VDDSA or VHSA selected based on the data being programmed to the memory cells (e.g., the bit line program voltage VSS can be used if the data being programed is a "1" and the bit line inhibit voltage VDDSA or VHSA can be used if the data being programmed is a "0" for single-level memory cells or (SLC)). The method continues with the step of 2402 maintaining a voltage applied to ones of the plurality of bit lines as the bit line inhibit voltage VDDSA or VHSA in response to the ones of the plurality of bit lines remaining unselected when programming a next one of the groups of the memory cells.

Again referring back to FIG. 8, for example, the memory holes are each coupled to one of a plurality of bit lines (e.g., bit lines BL0-BL2) and the plurality of bit lines are coupled to the control means. further including a charge pump (e.g., multi-stage charge pump 348 of FIG. 3B) configured to ramp up to the program voltage in a pump setting process and supply the program voltage to the plurality of word lines during the program operation and ramp down from the program voltage in a pump resetting process. Thus, according to an aspect, the method further includes the step of setting the charge pump in the pump setting process. Next, programming the groups of the memory cells with the data during the program operation. The method continues with the step of skipping the pump setting process and the pump resetting process of the charge pump in between each of the series of pulses of the program voltage. The method also includes the step of resetting the charge pump in the pump resetting process following programming the memory cells connected to a final one of the plurality of word lines connected to the memory cells being programmed in the program operation.

Once again referring back to FIG. 8, for example, the memory holes or NAND strings (e.g., NAND string 700n) are in rows comprising a plurality of strings. So, according to an aspect, the groups of the memory cells include sets of the memory cells associated with each of the plurality of strings.

As discussed, the memory apparatus can further include at least one data transfer latch (e.g., latches 194-197 of FIG. 2) configured to store the data being programmed to each of the groups of the memory cells during the program operation. Therefore, according to an aspect, the method further includes the step of maintaining the voltage applied to ones of the plurality of bit lines as the bit line inhibit voltage VDDSA or VHSA in response to the ones of the plurality of bit lines remaining unselected when programming the next one of the groups of the memory cells based on a comparison of the data of each of the groups of the memory cells to the data of the next one of the groups of the memory cells.

Again referring back to FIG. 5, for example, the plurality of word lines (e.g., WL0-WL95 of FIG. 5) and a plurality of dielectric layers (e.g., DL of FIG. 5) extend horizontally and overlay one another in an alternating fashion in a stack. The memory holes (e.g., MH of FIG. 5) extend vertically through the stack. The memory cells are connected in series between a drain-side select gate transistor (e.g., at SGD layer of FIG. 5) on a drain-side of each of the memory holes and a source-side select gate transistor (e.g., at SGS layer of FIG. 5) on a source-side of each of the memory holes. The drain-side select gate transistor of each of the memory holes is connected to one of the plurality of bit lines (e.g., BL of FIG. 5) and the source-side select gate transistor of each of the memory holes is connected to a source line (e.g., local interconnect 523a of FIG. 5). So, according to an aspect, the groups of the memory cells include collections of the memory cells associated with each of the plurality of word lines.

Now referring specifically to FIG. 25, the method can further include the step of 2500 determining whether the data for a next one of the collections of the memory cells associated with one of the plurality of word lines has been received. The method continues with the step of 2502 logically exclusive oring the data of one of the collections of the memory cells associated with the selected one of the plurality of word lines with the data for the next one of the collections of the memory cells associated with the one of the plurality of word lines data of the next one of the groups of the memory cells and determine a result. Next, 2504 determining whether the data of the one of the collections of the memory cells associated with the selected one of the plurality of word lines is equal to one in response to the result being one. The method then includes the step of 2506 ramping up the voltage applied to ones of the plurality of bit lines to the bit line inhibit voltage VDDSA or VHSA in response to the data of the one of the collections of the memory cells associated with the selected one of the plurality of word lines being equal to one. The method proceeds by 2508 ramping down the voltage applied to ones of the plurality of bit lines to bit line program voltage VSS in response to the data of the one of the collections of the memory cells associated with the selected one of the plurality of word lines not being equal to one.

The method additionally includes the step of 2510 determining whether the data of the one of the collections of the memory cells associated with the selected one of the plurality of word lines is equal to one in response to the result being zero. 2512 maintaining the voltage applied to ones of the plurality of bit lines at the bit line program voltage VSS in response to the data of the one of the collections of the memory cells associated with the selected one of the plurality of word lines being equal to one. The method also includes the step of 2514 maintaining the voltage applied to ones of the plurality of bit lines at the bit line inhibit voltage VDDSA or VHSA in response to the data of the one of the collections of the memory cells associated with the selected one of the plurality of word lines not being equal to one.

Referring back to FIG. 23, an unselected bit line voltage parameter stored in the memory apparatus is shown. So, according to an aspect, the method further includes the step of accessing the unselected bit line voltage parameter and maintaining the bit line inhibit voltage VDDSA or VHSA applied to ones of the plurality of bit lines in response to the ones of the plurality of bit lines remaining unselected when programming the next one of the groups of the memory cells based on the unselected bit line voltage parameter.

Clearly, changes may be made to what is described and illustrated herein without, however, departing from the scope defined in the accompanying claims. The foregoing description of the embodiments has been provided for purposes of illustration and description. It is not intended to be exhaustive or to limit the disclosure. Individual elements or features of a particular embodiment are generally not limited to that particular embodiment, but, where applicable, are interchangeable and can be used in a selected embodiment, even if not specifically shown or described. The same may also be varied in many ways. Such variations are not to be regarded as a departure from the disclosure, and all such modifications are intended to be included within the scope of the disclosure.

The terminology used herein is for the purpose of describing particular example embodiments only and is not intended to be limiting. As used herein, the singular forms "a," "an," and "the" may be intended to include the plural forms as well, unless the context clearly indicates otherwise. The terms "comprises," "comprising," "including," and "having," are inclusive and therefore specify the presence of stated features, integers, steps, operations, elements, and/or components, but do not preclude the presence or addition of one or more other features, integers, steps, operations, elements, components, and/or groups thereof. The method steps, processes, and operations described herein are not to be construed as necessarily requiring their performance in the particular order discussed or illustrated, unless specifically identified as an order of performance. It is also to be understood that additional or alternative steps may be employed.

When an element or layer is referred to as being "on," "engaged to," "connected to," or "coupled to" another element or layer, it may be directly on, engaged, connected or coupled to the other element or layer, or intervening elements or layers may be present. In contrast, when an element is referred to as being "directly on," "directly engaged to," "directly connected to," or "directly coupled to" another element or layer, there may be no intervening elements or layers present. Other words used to describe the relationship between elements should be interpreted in a like fashion (e.g., "between" versus "directly between," "adjacent" versus "directly adjacent," etc.). As used herein, the term "and/or" includes any and all combinations of one or more of the associated listed items.

Although the terms first, second, third, etc. may be used herein to describe various elements, components, regions, layers and/or sections, these elements, components, regions, layers and/or sections should not be limited by these terms. These terms may be only used to distinguish one element, component, region, layer or section from another region, layer or section. Terms such as "first," "second," and other numerical terms when used herein do not imply a sequence or order unless clearly indicated by the context. Thus, a first element, component, region, layer or section discussed below could be termed a second element, component, region, layer or section without departing from the teachings of the example embodiments.

Spatially relative terms, such as "inner," "outer," "beneath," "below," "lower," "above," "upper," "top", "bottom", and the like, may be used herein for ease of description to describe one element's or feature's relationship to another element(s) or feature(s) as illustrated in the figures. Spatially relative terms may be intended to encompass different orientations of the device in use or operation in addition to the orientation depicted in the figures. For example, if the device in the figures is turned over, elements described as "below" or "beneath" other elements or features would then be oriented "above" the other elements or features. Thus, the example term "below" can encompass both an orientation of above and below. The device may be otherwise oriented (rotated 90 degrees or at other orientations) and the spatially relative descriptions used herein interpreted accordingly.

What is claimed is:

1. A memory apparatus, comprising:
memory cells each connected to one of a plurality of word lines and disposed in memory holes coupled to a plurality of bit lines, the memory cells configured to retain a threshold voltage corresponding to one of a plurality of data states; and
a controller coupled to the plurality of word lines and the memory holes and configured to:
successively apply each of a series of pulses of a program voltage to selected ones of the plurality of word lines while simultaneously applying one of a bit line program voltage and a bit line inhibit voltage to ones of the plurality of bit lines coupled to the memory holes containing groups of the memory cells connected to the selected ones of the plurality of word lines to program the groups of the memory cells with data during a program operation, the one of the bit line program voltage and the bit line inhibit voltage selected based on the data being programmed to the memory cells, and
maintain a voltage applied to ones of the plurality of bit lines as the bit line inhibit voltage in response to the ones of the plurality of bit lines remaining unselected when programming a next one of the groups of the memory cells.

2. The memory apparatus as set forth in claim 1, wherein the memory holes are in rows comprising a plurality of strings and the groups of the memory cells include sets of the memory cells associated with each of the plurality of strings.

3. The memory apparatus as set forth in claim 1, further including at least one data transfer latch configured to store the data being programmed to each of the groups of the memory cells during the program operation and wherein the controller is further configured to maintain the voltage applied to ones of the plurality of bit lines as the bit line inhibit voltage in response to the ones of the plurality of bit lines remaining unselected when programming the next one of the groups of the memory cells based on a comparison of the data of each of the groups of the memory cells to the data of the next one of the groups of the memory cells.

4. The memory apparatus as set forth in claim 1, wherein the plurality of word lines and a plurality of dielectric layers extend horizontally and overlay one another in an alternating fashion in a stack, the memory holes extend vertically through the stack, the memory cells are connected in series between a drain-side select gate transistor on a drain-side of each of the memory holes and a source-side select gate transistor on a source-side of each of the memory holes, the drain-side select gate transistor of each of the memory holes is connected to one of the plurality of bit lines and the source-side select gate transistor of each of the memory holes is connected to a source line, and the groups of the memory cells include collections of the memory cells associated with each of the plurality of word lines.

5. The memory apparatus as set forth in claim 4, wherein the controller is further configured to:
determine whether the data for a next one of the collections of the memory cells associated with one of the plurality of word lines has been received;
logically exclusive or the data of one of the collections of the memory cells associated with the selected one of the plurality of word lines with the data for the next one of the collections of the memory cells associated with the one of the plurality of word lines data of the next one of the groups of the memory cells and determine a result;
determine whether the data of the one of the collections of the memory cells associated with the selected one of the plurality of word lines is equal to one in response to the result being one;
ramp up the voltage applied to ones of the plurality of bit lines to the bit line inhibit voltage in response to the data of the one of the collections of the memory cells associated with the selected one of the plurality of word lines being equal to one;
ramp down the voltage applied to ones of the plurality of bit lines to bit line program voltage in response to the data of the one of the collections of the memory cells associated with the selected one of the plurality of word lines not being equal to one;
determine whether the data of the one of the collections of the memory cells associated with the selected one of the plurality of word lines is equal to one in response to the result being zero;
maintain the voltage applied to ones of the plurality of bit lines at the bit line program voltage in response to the data of the one of the collections of the memory cells associated with the selected one of the plurality of word lines being equal to one; and
maintain the voltage applied to ones of the plurality of bit lines at the bit line inhibit voltage in response to the data of the one of the collections of the memory cells associated with the selected one of the plurality of word lines not being equal to one.

6. The memory apparatus as set forth in claim 1, further including a charge pump coupled to the controller and configured to ramp up to the program voltage in a pump setting process and supply the program voltage to the plurality of word lines during the program operation and ramp down from the program voltage in a pump resetting process and wherein the controller is further configured to:
set the charge pump in the pump setting process;
program the groups of the memory cells with the data during the program operation;
skip the pump setting process and the pump resetting process of the charge pump in between each of the series of pulses of the program voltage; and
reset the charge pump in the pump resetting process following programming the memory cells connected to a final one of the plurality of word lines connected to the memory cells being programmed in the program operation.

7. The memory apparatus of claim 1, further including an unselected bit line voltage parameter stored in the memory apparatus and the controller is further configured to access the unselected bit line voltage parameter and maintain the bit line inhibit voltage applied to ones of the plurality of bit lines in response to the ones of the plurality of bit lines remaining unselected when programming the next one of the groups of the memory cells based on the unselected bit line voltage parameter.

8. A controller in communication with a memory apparatus including memory cells each connected to one of a plurality of word lines and disposed in memory holes coupled to a plurality of bit lines, the memory cells configured to retain a threshold voltage corresponding to one of a plurality of data states, the controller configured to:
  instruct the memory apparatus to successively apply each of a series of pulses of a program voltage to selected ones of the plurality of word lines while simultaneously applying one of a bit line program voltage and a bit line inhibit voltage to ones of the plurality of bit lines coupled to the memory holes containing groups of the memory cells connected to the selected ones of the plurality of word lines to program the groups of the memory cells with data during a program operation, the one of the bit line program voltage and the bit line inhibit voltage selected based on the data being programmed to the memory cells; and
  instruct the memory apparatus to maintain a voltage applied to ones of the plurality of bit lines as the bit line inhibit voltage in response to the ones of the plurality of bit lines remaining unselected when programming a next one of the groups of the memory cells.

9. The controller as set forth in claim 8, wherein the memory holes are in rows comprising a plurality of strings and the groups of the memory cells include sets of the memory cells associated with each of the plurality of strings.

10. The controller as set forth in claim 8, wherein the memory apparatus further includes at least one data transfer latch configured to store the data being programmed to each of the groups of the memory cells during the program operation and wherein the controller is further configured to maintain the voltage applied to ones of the plurality of bit lines as the bit line inhibit voltage in response to the ones of the plurality of bit lines remaining unselected when programming the next one of the groups of the memory cells based on a comparison of the data of each of the groups of the memory cells to the data of the next one of the groups of the memory cells.

11. The controller as set forth in claim 8, wherein the plurality of word lines and a plurality of dielectric layers extend horizontally and overlay one another in an alternating fashion in a stack, the memory holes extend vertically through the stack, the memory cells are connected in series between a drain-side select gate transistor on a drain-side of each of the memory holes and a source-side select gate transistor on a source-side of each of the memory holes, the drain-side select gate transistor of each of the memory holes is connected to one of the plurality of bit lines and the source-side select gate transistor of each of the memory holes is connected to a source line, and the groups of the memory cells include collections of the memory cells associated with each of the plurality of word lines.

12. The controller as set forth in claim 11, wherein the controller is further configured to:
  determine whether the data for a next one of the collections of the memory cells associated with one of the plurality of word lines has been received;
  instruct the memory apparatus to logically exclusive or the data of one of the collections of the memory cells associated with the selected one of the plurality of word lines with the data for the next one of the collections of the memory cells associated with the one of the plurality of word lines data of the next one of the groups of the memory cells and determine a result;
  determine whether the data of the one of the collections of the memory cells associated with the selected one of the plurality of word lines is equal to one in response to the result being one;
  instruct the memory apparatus to ramp up the voltage applied to ones of the plurality of bit lines to the bit line inhibit voltage in response to the data of the one of the collections of the memory cells associated with the selected one of the plurality of word lines being equal to one;
  instruct the memory apparatus to ramp down the voltage applied to ones of the plurality of bit lines to bit line program voltage in response to the data of the one of the collections of the memory cells associated with the selected one of the plurality of word lines not being equal to one;
  determine whether the data of the one of the collections of the memory cells associated with the selected one of the plurality of word lines is equal to one in response to the result being zero;
  instruct the memory apparatus to maintain the voltage applied to ones of the plurality of bit lines at the bit line program voltage in response to the data of the one of the collections of the memory cells associated with the selected one of the plurality of word lines being equal to one; and
  instruct the memory apparatus to maintain the voltage applied to ones of the plurality of bit lines at the bit line inhibit voltage in response to the data of the one of the collections of the memory cells associated with the selected one of the plurality of word lines not being equal to one.

13. The controller as set forth in claim 8, wherein the memory apparatus further includes a charge pump configured to ramp up to the program voltage in a pump setting process and supply the program voltage to the plurality of word lines during the program operation and ramp down from the program voltage in a pump resetting process and the controller is further configured to:
  instruct the memory apparatus to set the charge pump in the pump setting process;
  instruct the memory apparatus to program the groups of the memory cells with the data during the program operation;
  instruct the memory apparatus to skip the pump setting process and the pump resetting process of the charge pump in between each of the series of pulses of the program voltage; and
  instruct the memory apparatus to reset the charge pump in the pump resetting process following programming the memory cells connected to a final one of the plurality of word lines connected to the memory cells being programmed in the program operation.

14. A method of operating a memory apparatus including memory cells each connected to one of a plurality of word lines and disposed in memory holes coupled to a plurality of bit lines, the memory cells configured to retain a threshold voltage corresponding to one of a plurality of data states, the method comprising the steps of:
- successively applying each of a series of pulses of a program voltage to selected ones of the plurality of word lines while simultaneously applying one of a bit line program voltage and a bit line inhibit voltage to ones of the plurality of bit lines coupled to the memory holes containing groups of the memory cells connected to the selected ones of the plurality of word lines to program the groups of the memory cells with data during a program operation, the one of the bit line program voltage and the bit line inhibit voltage selected based on the data being programmed to the memory cells; and
- maintaining a voltage applied to ones of the plurality of bit lines as the bit line inhibit voltage in response to the ones of the plurality of bit lines remaining unselected when programming a next one of the groups of the memory cells.

15. The method as set forth in claim 14, wherein the memory holes are in rows comprising a plurality of strings and the groups of the memory cells include sets of the memory cells associated with each of the plurality of strings.

16. The method as set forth in claim 14, wherein the memory apparatus further includes at least one data transfer latch configured to store the data being programmed to each of the groups of the memory cells during the program operation and wherein the method further includes the step of maintaining the voltage applied to ones of the plurality of bit lines as the bit line inhibit voltage in response to the ones of the plurality of bit lines remaining unselected when programming the next one of the groups of the memory cells based on a comparison of the data of each of the groups of the memory cells to the data of the next one of the groups of the memory cells.

17. The method as set forth in claim 14, wherein the plurality of word lines and a plurality of dielectric layers extend horizontally and overlay one another in an alternating fashion in a stack, the memory holes extend vertically through the stack, the memory cells are connected in series between a drain-side select gate transistor on a drain-side of each of the memory holes and a source-side select gate transistor on a source-side of each of the memory holes, the drain-side select gate transistor of each of the memory holes is connected to one of the plurality of bit lines and the source-side select gate transistor of each of the memory holes is connected to a source line, and the groups of the memory cells include collections of the memory cells associated with each of the plurality of word lines.

18. The method as set forth in claim 17, further including the steps of:
- determining whether the data for a next one of the collections of the memory cells associated with one of the plurality of word lines has been received;
- logically exclusive oring the data of one of the collections of the memory cells associated with the selected one of the plurality of word lines with the data for the next one of the collections of the memory cells associated with the one of the plurality of word lines data of the next one of the groups of the memory cells and determine a result;
- determining whether the data of the one of the collections of the memory cells associated with the selected one of the plurality of word lines is equal to one in response to the result being one;
- ramping up the voltage applied to ones of the plurality of bit lines to the bit line inhibit voltage in response to the data of the one of the collections of the memory cells associated with the selected one of the plurality of word lines being equal to one;
- ramping down the voltage applied to ones of the plurality of bit lines to bit line program voltage in response to the data of the one of the collections of the memory cells associated with the selected one of the plurality of word lines not being equal to one;
- determining whether the data of the one of the collections of the memory cells associated with the selected one of the plurality of word lines is equal to one in response to the result being zero;
- maintaining the voltage applied to ones of the plurality of bit lines at the bit line program voltage in response to the data of the one of the collections of the memory cells associated with the selected one of the plurality of word lines being equal to one; and
- maintaining the voltage applied to ones of the plurality of bit lines at the bit line inhibit voltage in response to the data of the one of the collections of the memory cells associated with the selected one of the plurality of word lines not being equal to one.

19. The method as set forth in claim 14, wherein the memory apparatus further includes a charge pump configured to ramp up to the program voltage in a pump setting process and supply the program voltage to the plurality of word lines during the program operation and ramp down from the program voltage in a pump resetting process and the method further includes the steps of:
- setting the charge pump in the pump setting process;
- programming the groups of the memory cells with the data during the program operation;
- skipping the pump setting process and the pump resetting process of the charge pump in between each of the series of pulses of the program voltage; and
- resetting the charge pump in the pump resetting process following programming the memory cells connected to a final one of the plurality of word lines connected to the memory cells being programmed in the program operation.

20. The method as set forth in claim 14, wherein the memory apparatus further includes an unselected bit line voltage parameter stored in the memory apparatus and the method further includes the step of accessing the unselected bit line voltage parameter and maintaining the bit line inhibit voltage applied to ones of the plurality of bit lines in response to the ones of the plurality of bit lines remaining unselected when programming the next one of the groups of the memory cells based on the unselected bit line voltage parameter.

* * * * *